US008644051B2

(12) United States Patent
Kanda

(10) Patent No.: US 8,644,051 B2
(45) Date of Patent: Feb. 4, 2014

(54) SEMICONDUCTOR MEMORY DEVICE AND CONTROL METHOD OF THE SAME

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/230,156

(22) Filed: Sep. 12, 2011

(65) Prior Publication Data

US 2012/0002457 A1 Jan. 5, 2012

Related U.S. Application Data

(63) Continuation of application No. PCT/JP2010/054728, filed on Mar. 12, 2010.

(30) Foreign Application Priority Data

Mar. 18, 2009 (JP) ................................ 2009-067010

(51) Int. Cl.
*G11C 11/00* (2006.01)

(52) U.S. Cl.
USPC .......................................................... 365/148

(58) Field of Classification Search
USPC .......................................................... 365/148
See application file for complete search history.

(56) References Cited

U.S. PATENT DOCUMENTS

| | | | | |
|---|---|---|---|---|
| 5,652,723 | A * | 7/1997 | Dosaka et al. | 365/189.2 |
| 5,877,780 | A * | 3/1999 | Lu et al. | 345/519 |
| 6,965,987 | B2 * | 11/2005 | Senter Brashears et al. | 712/245 |
| 2001/0040827 | A1 * | 11/2001 | Dosaka et al. | 365/189.01 |
| 2002/0093862 | A1 * | 7/2002 | Akioka | 365/201 |
| 2004/0085850 | A1 * | 5/2004 | Kato et al. | 365/233 |
| 2006/0023554 | A1 * | 2/2006 | Matsushita et al. | 365/230.03 |
| 2008/0025085 | A1 | 1/2008 | Scheuerlein et al. | |
| 2008/0025134 | A1 * | 1/2008 | Scheuerlein et al. | 365/230.06 |
| 2008/0055958 | A1 * | 3/2008 | Takemura et al. | 365/63 |
| 2008/0239932 | A1 | 10/2008 | Kamata et al. | |
| 2009/0034123 | A1 | 2/2009 | Aoki et al. | |
| 2010/0246280 | A1 * | 9/2010 | Kanda | 365/189.05 |

FOREIGN PATENT DOCUMENTS

| | | |
|---|---|---|
| JP | 1-223542 | 9/1989 |
| JP | 9-245473 | 9/1997 |
| JP | 11-185478 | 7/1999 |
| JP | 2006-40497 | 2/2006 |
| JP | 2006-127623 | 5/2006 |

(Continued)

OTHER PUBLICATIONS

International Search Report mailed Jun. 29, 2010 in PCT/JP2010/054728 filed Mar. 12, 2010 (in English).

(Continued)

*Primary Examiner* — Huan Hoang
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a semiconductor memory device includes a plurality of memory cell arrays each includes a plurality of memory cells, the plurality of memory cell arrays being stacked on a semiconductor substrate to form a three-dimensional structure, and a data input/output circuit includes a first address buffer and a second address buffer configured to store a first address and a second address of the plurality of memory cells, and a controller configured to perform control to time-divisionally output the first address and the second address to a first address bus and a second address bus in data input/output.

16 Claims, 30 Drawing Sheets

(56) References Cited

FOREIGN PATENT DOCUMENTS

| JP | 2008-33379 | 2/2008 |
|----|------------|--------|
| JP | 2008-276904 | 11/2008 |
| JP | 2008-276905 | 11/2008 |
| WO | WO 2006/051779 A1 | 5/2006 |
| WO | WO 2008/016950 A2 | 2/2008 |

OTHER PUBLICATIONS

International Written Opinion mailed Jun. 29, 2010 in PCT/JP2010/054728 filed Mar. 12, 2010 (in English).

* cited by examiner

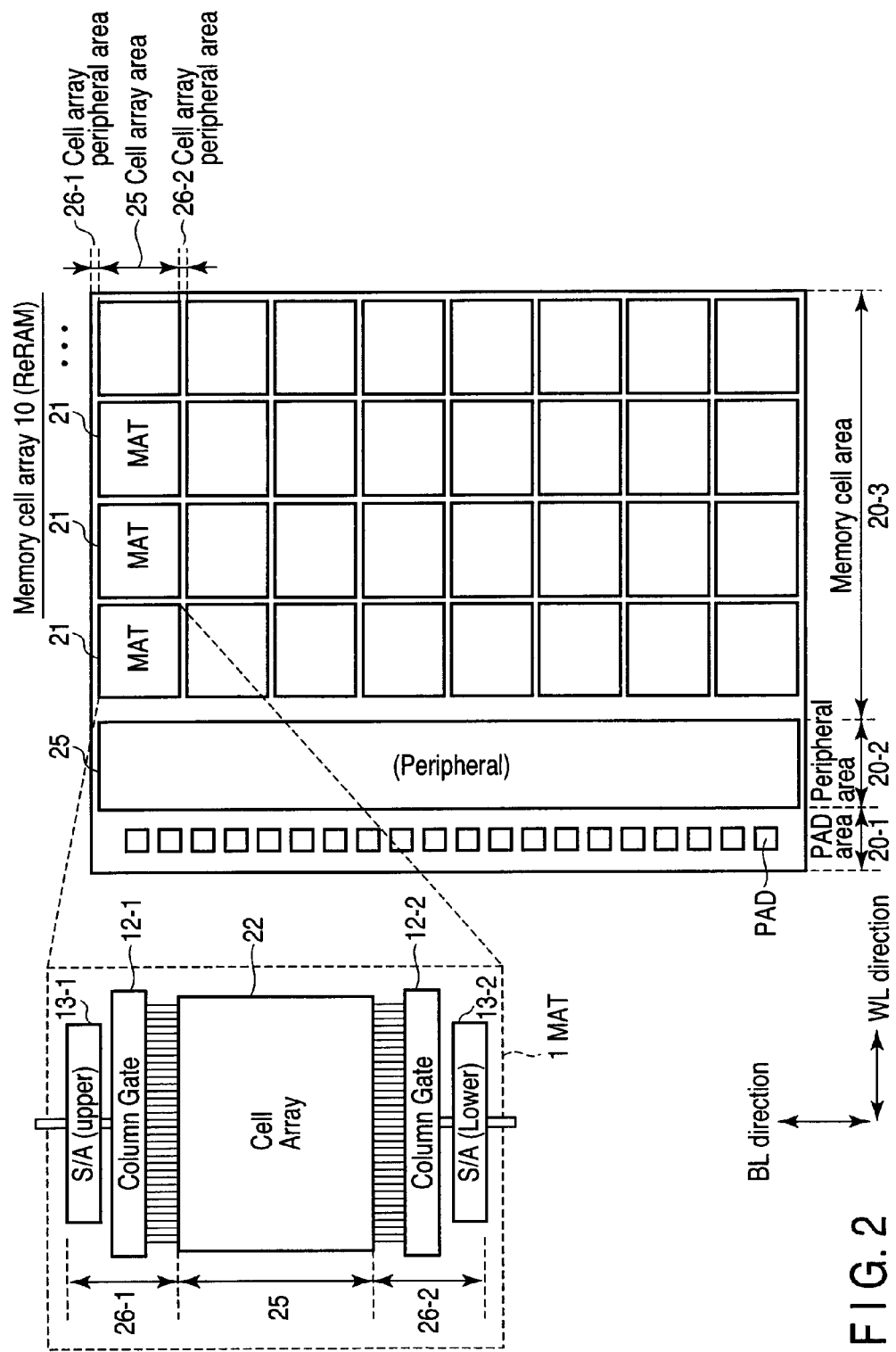
F I G. 2

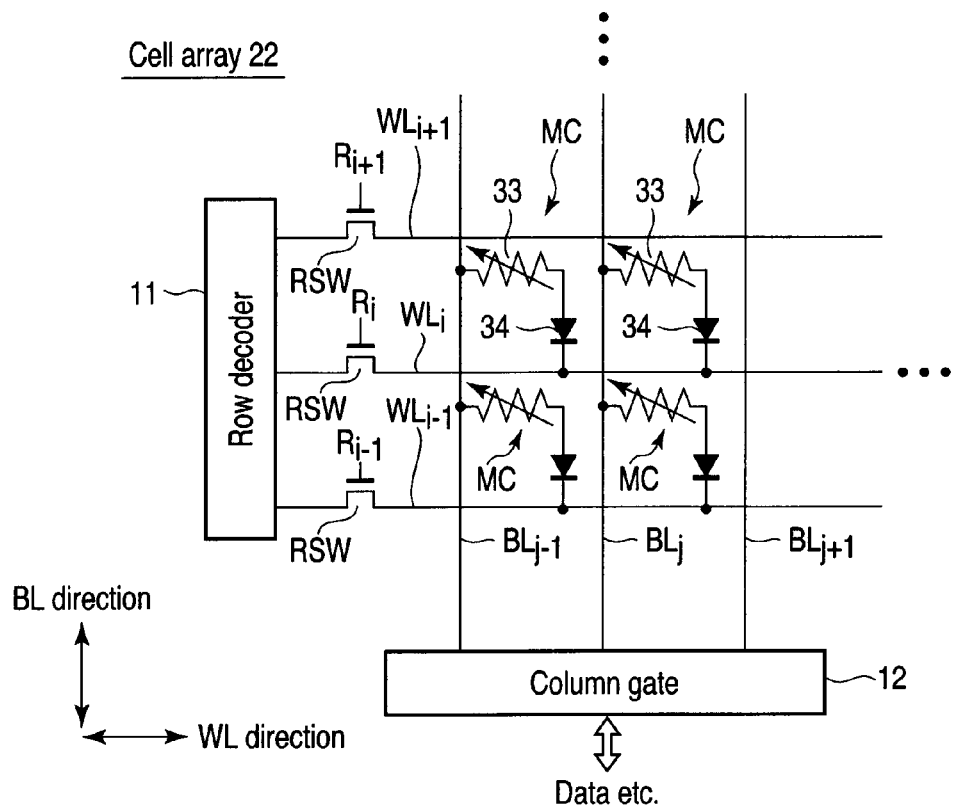
F I G. 3
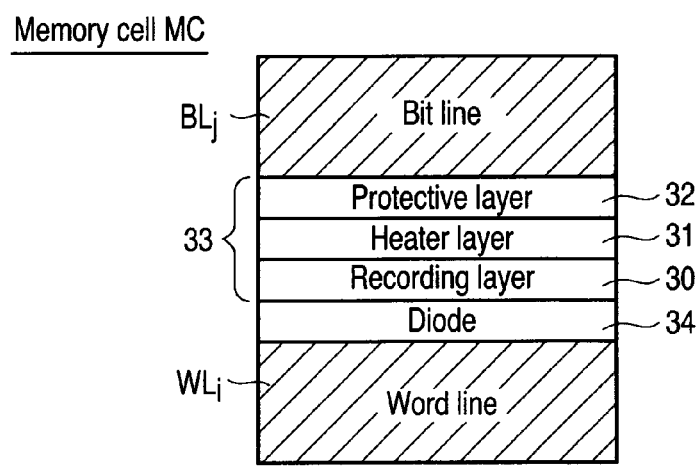
F I G. 4

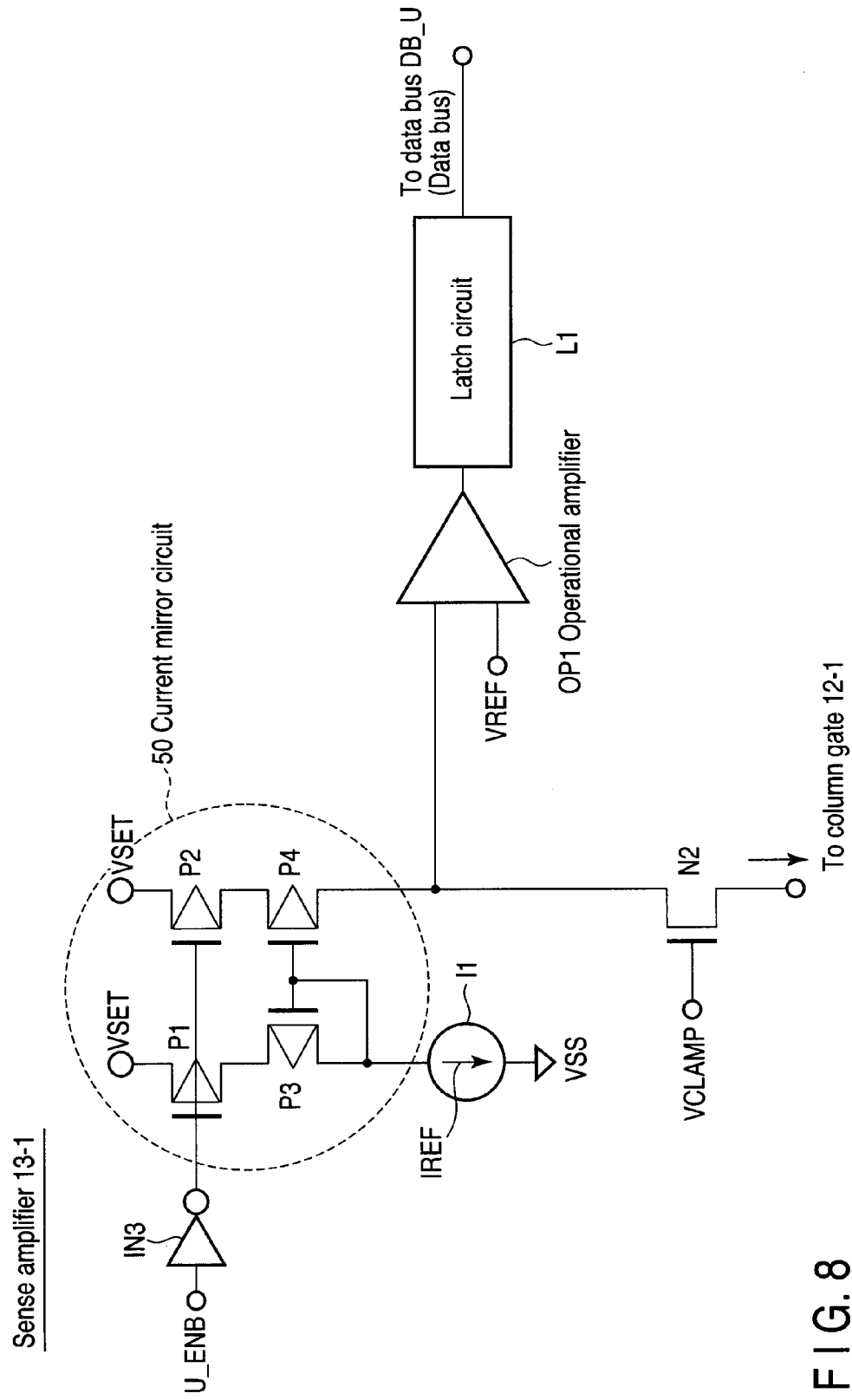
F I G. 8

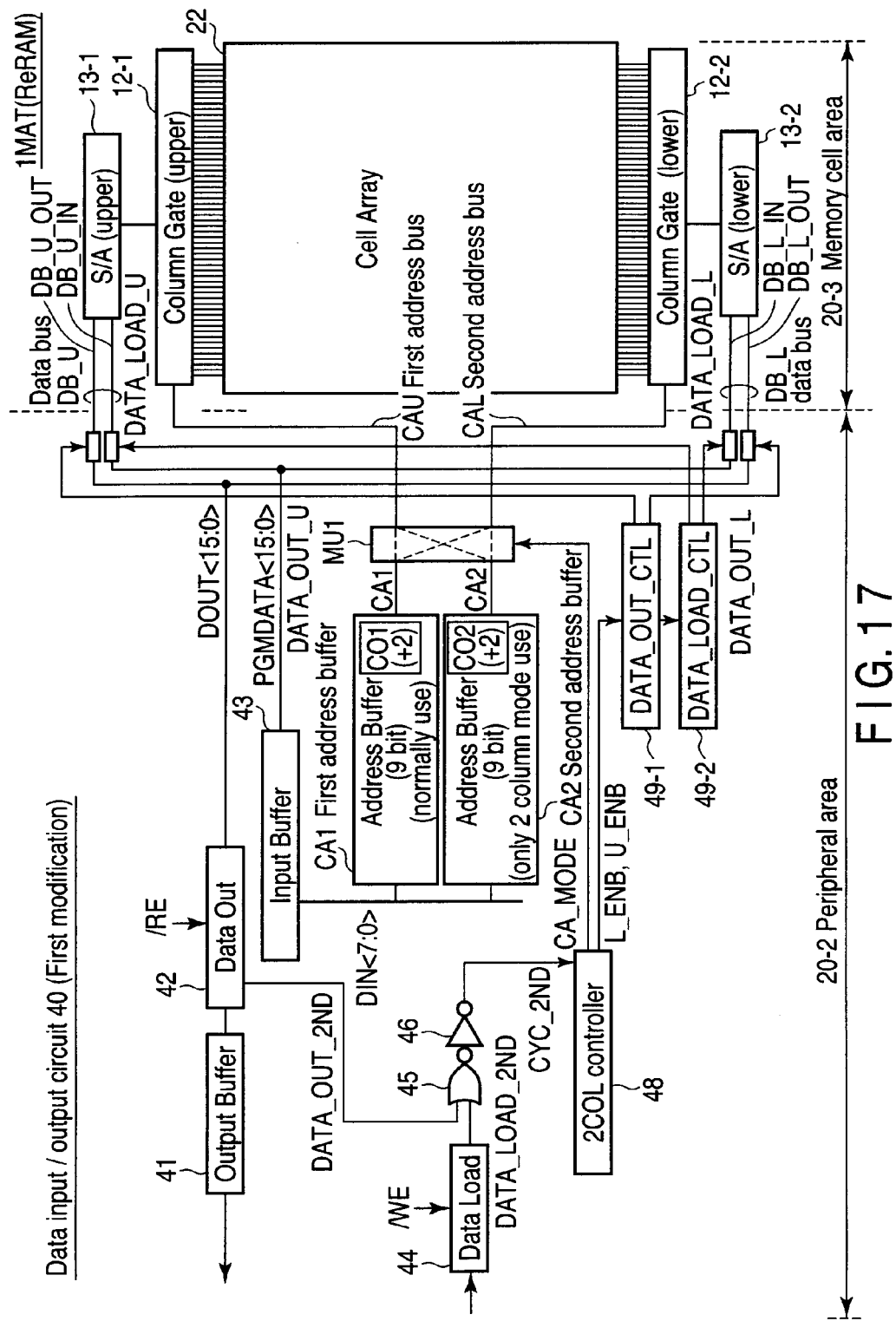
F I G. 17

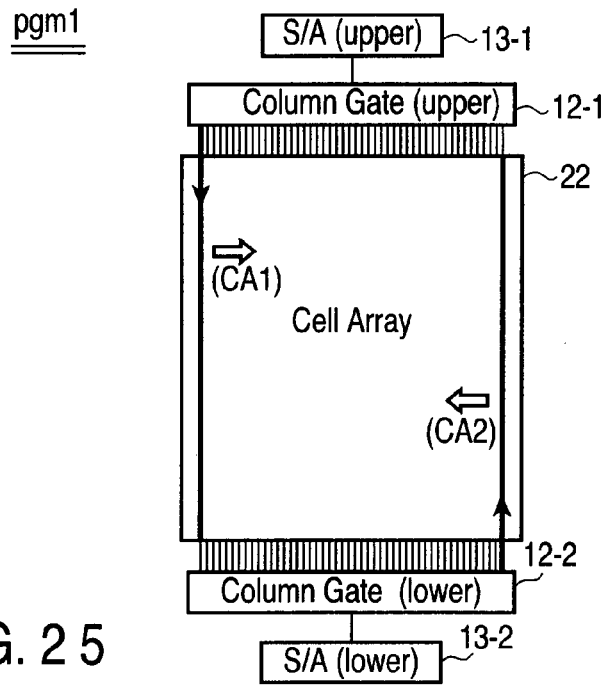
F I G. 25
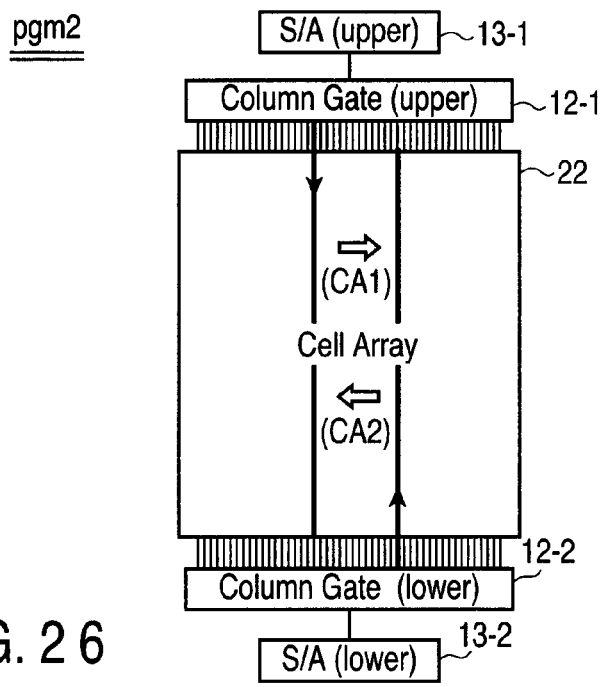
F I G. 26

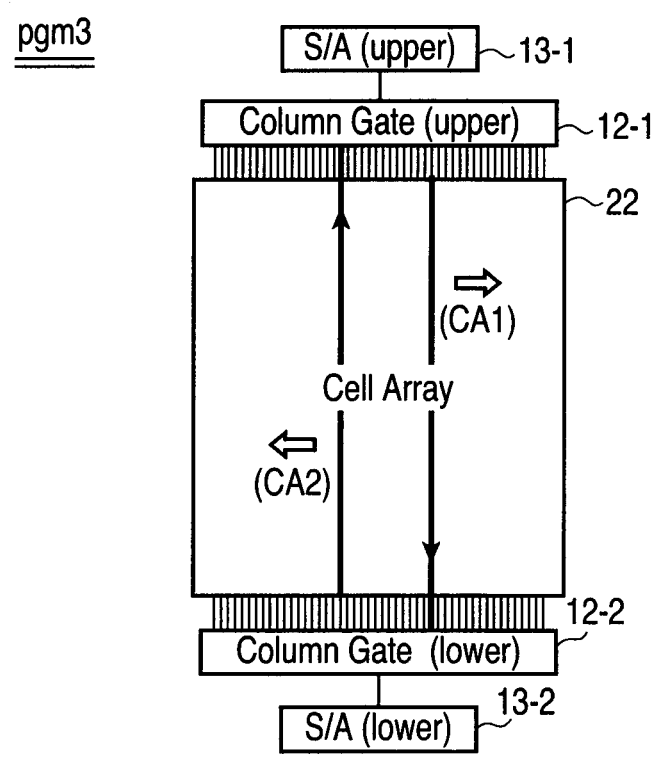
F I G. 27

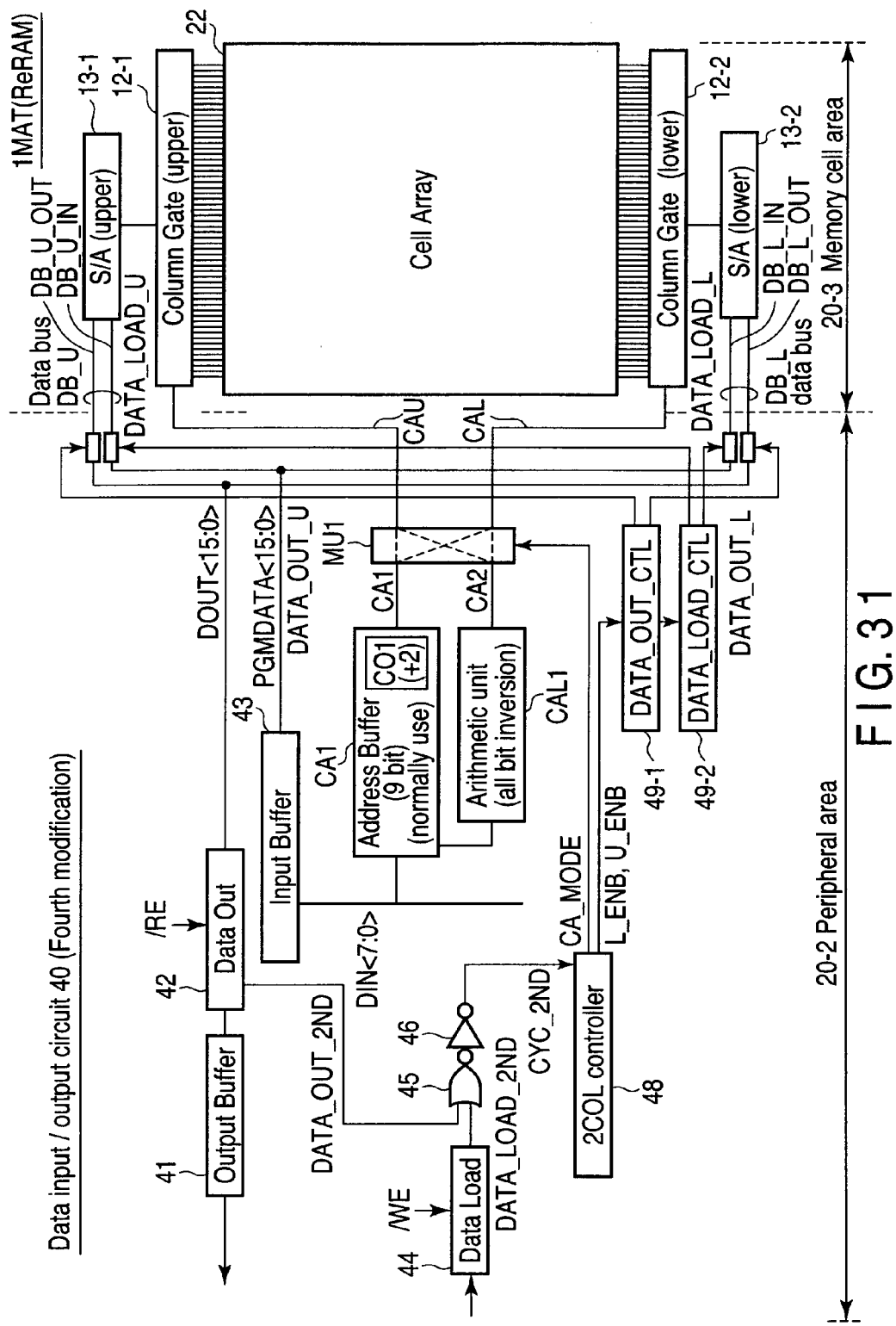
F I G. 31

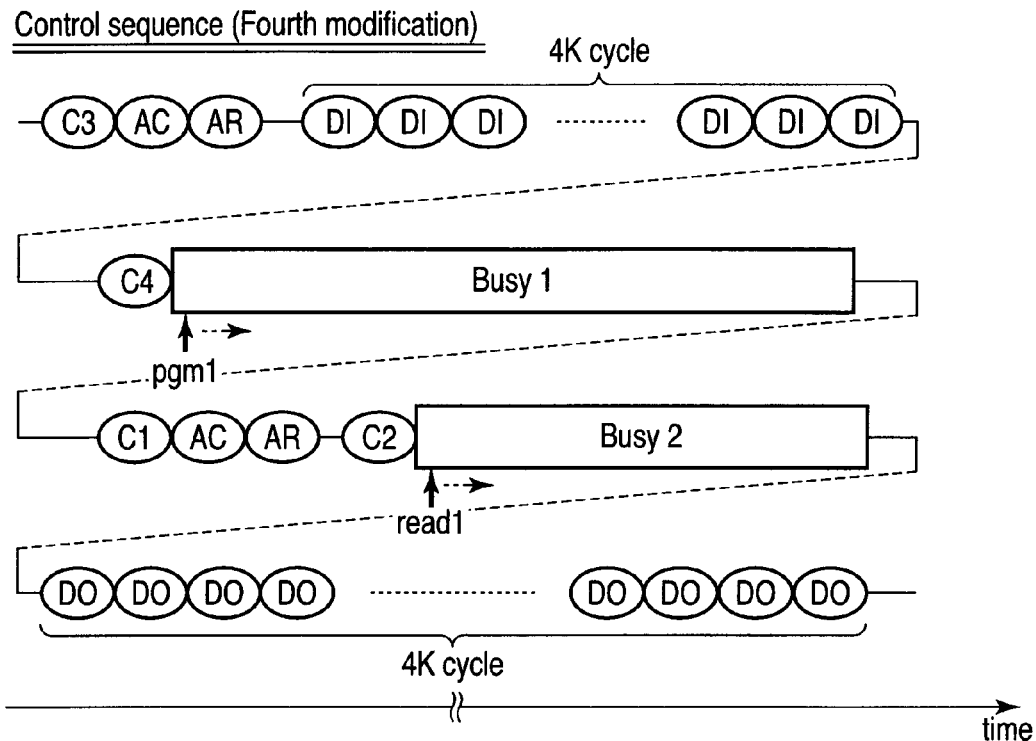
F I G. 3 2
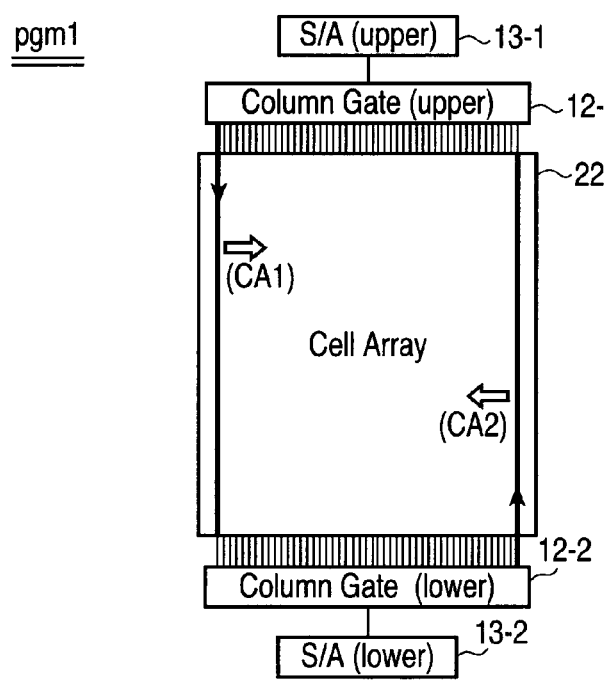
F I G. 3 3

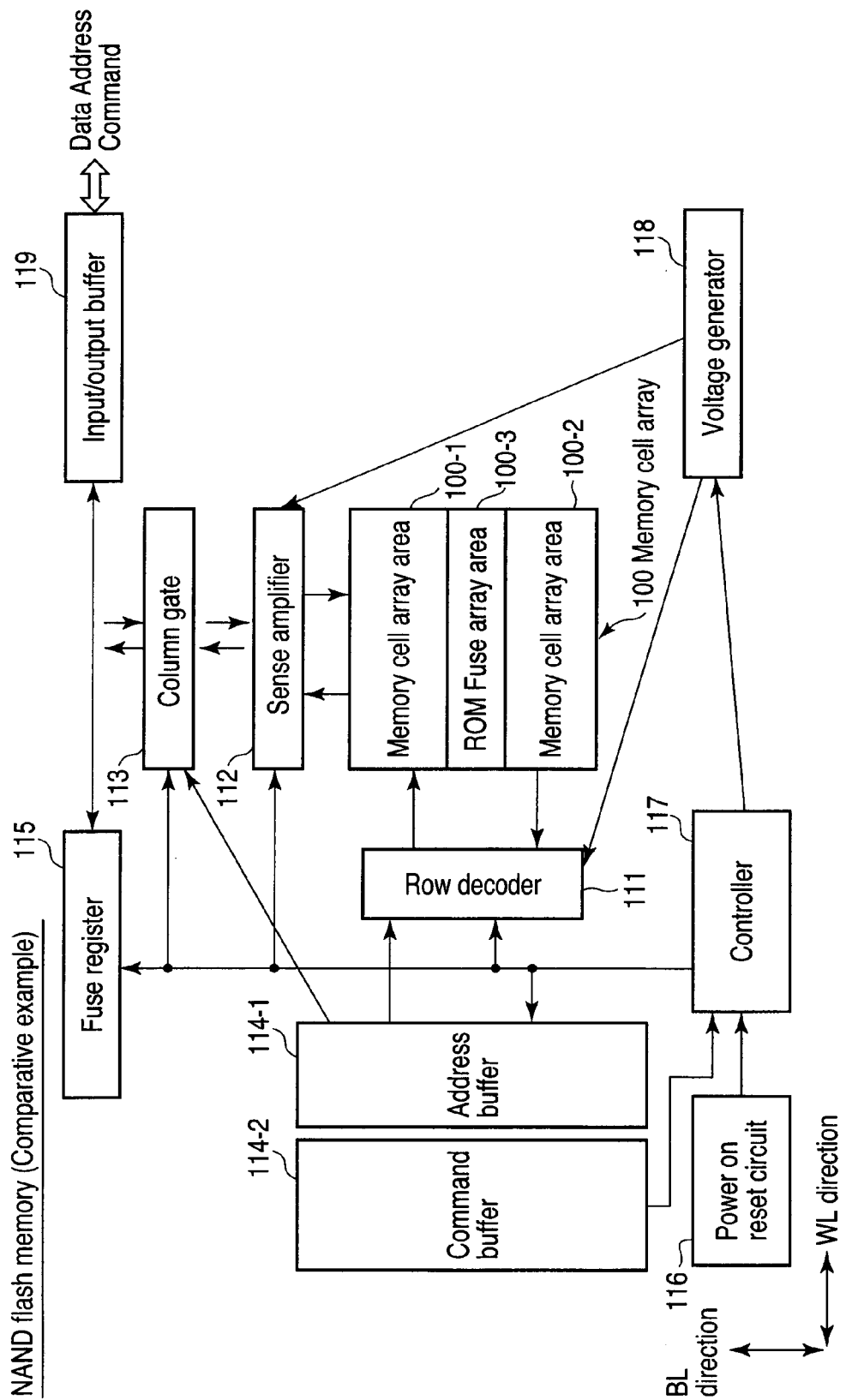
F I G. 3 4

US 8,644,051 B2

SEMICONDUCTOR MEMORY DEVICE AND CONTROL METHOD OF THE SAME

CROSS-REFERENCE TO RELATED APPLICATIONS

This application is a Continuation Application of PCT Application No. PCT/JP2010/054728, filed Mar. 12, 2010 and based upon and claiming the benefit of priority from prior Japanese Patent Application No. 2009-067010, filed Mar. 18, 2009, the entire contents of all of which are incorporated herein by reference.

FIELD

Embodiments described herein relate generally to a semiconductor memory device and a control method of the same.

BACKGROUND

A ReRAM (Resistance Random Access Memory) is an example of semiconductor memory devices attracting attention as post-NAND flash memories (e.g., Jpn. Pat. Appln. KOKAI Publication Nos. 2008-276904 and 2008-276905). NAND flash memories are widely spreading semiconductor memory devices recently incorporated into memory cards such as an SD card (registered trademark).

BRIEF DESCRIPTION OF THE DRAWINGS

FIG. 2 is a plan view showing a memory cell array shown in FIG. 1;

FIG. 3 is an equivalent circuit diagram showing a cell array shown in FIG. 2;

FIG. 4 is a sectional view showing a memory cell shown in FIG. 3;

FIG. 8 is an equivalent circuit diagram showing a sense amplifier according to the first embodiment;

FIG. 17 is a view showing a data input/output circuit and one MAT according to the first modification;

FIG. 25 is a view showing the state of access to memory cells in a busy state shown in FIG. 24;

FIG. 26 is a view showing the state of access to memory cells in the busy state shown in FIG. 24;

FIG. 27 is a view showing the state of access to memory cells in the busy state shown in FIG. 24;

FIG. 31 is a view showing a data input/output circuit and one MAT according to the fourth modification;

FIG. 32 is a view showing the control sequence of a semiconductor memory device according to the fourth modification;

FIG. 33 is a view showing the state of access to memory cells in a busy state shown in FIG. 32;

FIG. 34 is a view showing the overall configuration of a semiconductor memory device (NAND flash memory) according to a comparative example;

DETAILED DESCRIPTION

Figure 1:
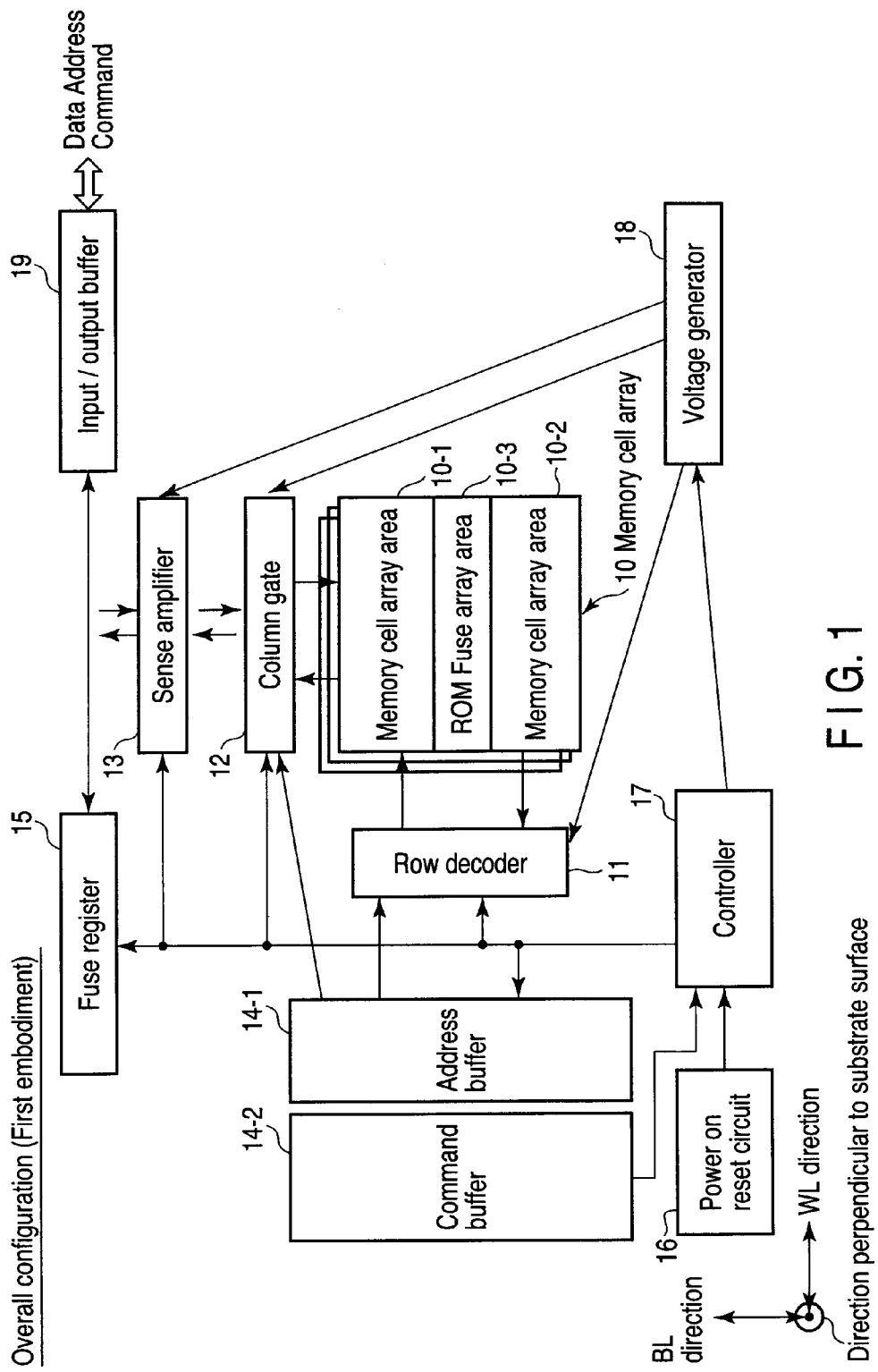
FIG. 1 is a view showing the overall configuration of a semiconductor memory device according to the first embodiment of the present invention.

In general, according to one embodiment, a semiconductor memory device according to an aspect of the present invention comprises a plurality of memory cell arrays each comprising a plurality of memory cells, the plurality of memory cell arrays being stacked on a semiconductor substrate to form a three-dimensional structure; and a data input/output circuit comprising a first address buffer and a second address buffer configured to store a first address and a second address of the plurality of memory cells, and a controller configured to perform control to time-divisionally output the first address and the second address to a first address bus and a second address bus in data input/output.

When applying an interface (NAND interface) complying with a NAND flash memory to a memory such as the ReRAM described above, addresses must time-divisionally be input because the number of pins is small. Therefore, an architecture capable of simultaneously accessing a plurality of memory cells is necessary (although this is not page access to a NAND flash memory).

Accordingly, when applying the NAND interface to the above-mentioned ReRAM or the like, it is impossible to simultaneously access a plurality of memory cells. This is often disadvantageous in increasing the speed of access to a memory cell.

Embodiments of the present invention will be explained below with reference to the accompanying drawings. Note that in the following explanation, the same reference numerals denote the same parts throughout the drawings.

[First Embodiment (ReRAM)]

First, a semiconductor memory device and a control method of the same according to the first embodiment of the present invention will be explained below with reference to FIGS. 1 to 13. In this embodiment, a ReRAM (Resistance Random Access Memory) will be explained as an example of a semiconductor memory device in which memory cells are randomly accessed.

<1. Configuration Example>

1-1. Overall Configuration Example

First, an example of the overall configuration of the semiconductor memory device according to the first embodiment will be explained below with reference to FIG. 1.

As shown in FIG. 1, the semiconductor memory device according to this embodiment includes a memory cell array 10, row decoder 11, column gate 12, sense amplifier 13, address buffer 14-1, command buffer 14-2, fuse register 15, power on reset circuit 16, controller 17, voltage generator 18, and input/output buffer 19.

The memory cell array 10 includes memory cell array areas 10-1 and 10-2 each including a plurality of memory cells to be randomly accessed arranged in a matrix at the intersections of a plurality of bit lines and word lines, and a ROM Fuse array area 10-3. Also, the memory cell array 10 has a three-dimensional structure in which a plurality of memory cell arrays are stacked in a direction perpendicular to the substrate surface of a semiconductor substrate as will be described later.

The row decoder 11 decodes addresses in the row direction (WL direction). Also, the row decoder 11 includes a driver for driving word lines.

The column gate 12 decodes addresses in the column direction (BL direction). Also, the column gate 12 includes a driver for driving the bit lines. In this embodiment, although not shown in FIG. 1, column gates 12 are arranged in the upper and lower portions of the memory cell array 10 as will be described later.

The sense amplifier 13 is electrically connected to the column gate 12 and bit lines, and reads out data from the memory cells. In this embodiment, although not shown in FIG. 1, sense amplifiers 13 are arranged in the upper and lower portions of the memory cell array 10. The number of the sense amplifiers 13 is a plurality of number of times larger than the number of bits of I/O pins 0 to 7 (to be described later).

The address buffer 14-1 is electrically connected to the row decoder 11 and column gate 12, and temporarily holds a row address and column address.

The command buffer 14-2 is electrically connected to the controller 17, and temporarily holds a control command.

The fuse register 15 is electrically connected to the input/output buffer 19 via a data bus line, and holds necessary data such as management data.

The power on reset circuit 16 senses the power on of this device, and outputs a reset signal to the controller 17.

The voltage generator 18 is electrically connected to the row decoder 11, column gate 12, and sense amplifier 13, and applies voltages necessary for these circuits under the control of the controller 17.

The input/output buffer 19 is electrically connected to the sense amplifier 13 and fuse register 15 via the data bus line, and temporarily holds data, addresses, and commands from an external apparatus such as a host apparatus.

The controller 17 controls the circuits described above. For example, the controller 17 performs data write, data read, and data erase by controlling the above-mentioned circuits.

1-2. Configuration Example of Memory Cell Array

An example of the configuration of the memory cell array 10 according to this embodiment will be explained below with reference to FIG. 2. As shown in FIG. 2, the memory cell array 10 according to this embodiment includes a plurality of MATs (mats) 21, a peripheral circuit 25, and PADs (pads).

The plurality of MATs 21 are arranged in a memory cell area 20-3. Also, as enclosed with the broken lines, each (one MAT) of the plurality of MATs 21 includes a cell array 22, column gates 12-1 and 12-2, and sense amplifiers 13-1 and 13-2.

The cell array 22 is formed in a cell array area 27, and includes a plurality of memory cells to be randomly accessed arranged in a matrix at the intersections of a plurality of word lines and a plurality of bit lines.

The column gate 12-1 is formed in the upper portion of the cell array 22 in a cell array peripheral area 26-1. The column gate 12-2 is formed in the lower portion of the cell array 22 in a cell array peripheral area 26-2.

The sense amplifier 13-1 is formed in the upper portion of the column gate 12-1 in the cell array peripheral area 26-1. The sense amplifier 13-2 is formed in the lower portion of the column gate 12-2 in the cell array peripheral area 26-2.

The peripheral circuit 25 is formed in a peripheral area 20-2. The peripheral circuit 25 includes a data input/output circuit (to be described later).

The PADs (pads) are arranged in a PAD area 20-1. The pads include I/O pads 0 to 7 to which addresses and commands are input, and control pads such as a /CE pad to which a chip enable signal is input.

1-3. Circuit Configuration and Operation Example of Cell Array

The circuit configuration and an example of the operation of the cell array 22 according to this embodiment will be explained below with reference to FIG. 3. As shown in FIG. 3, the cell array 22 according to this embodiment includes a plurality of memory cells MC to be randomly accessed arranged in a matrix at the intersections of a plurality of bit lines BLj−1 to BLj+1 and a plurality of word lines WLi−1 to WLi+1.

Each of the memory cells MC includes a variable resistance element 33 and diode 34. The current path of the variable resistance element has one end connected to one of the bit lines BLj−1 to BLj+1, and the other end connected to the anode of the diode 34. The cathode of the diode 34 is connected to one of the word lines WLi−1 to WLi+1.

One end of each of the word lines WLi−1 to WLi+1 is connected to the row decoder 11 via a MOS transistor RSW as a selection switch. One end of each of the bit lines BLj−1 to BLj+1 is electrically connected to the column gate 12.

Selection signals Ri−1, Ri, and Ri+1 each for selecting one word line (row) are input to the gates of the MOS transistors RSW.

<Data Write Operation (Information Recording/Setting Operation)>

A data write operation of the memory cell MC will briefly be explained below.

Data can be written by applying a voltage to the variable resistance element 33 of a selected memory cell MC, and generating a potential gradient in the selected variable resistance element 33, thereby supplying an electric current. For example, a state in which the potential of the word line WLi is relatively lower than that of the bit line BLj is formed. Assuming that the bit line BLj is at a fixed potential (e.g., about 3 V), the ground potential need only be applied to the word line WLi.

Note that in this data write operation, unselected word lines WLi−1 and WLi+1 and unselected bit lines BLj−1 and BLj+1 are preferably all biased to the same potential. Note also that in a standby state before the data write operation, all the word lines WLi−1, WLi, and WLi+1 and all the bit lines BLj−1, BLj, and BLj+1 are preferably precharged. Furthermore, the voltage for information recording may also be generated by forming a state in which the potential of the bit line BLj is relatively higher than that of the word line WLi.

<Data Read Operation (Information Reproducing Operation)>

A data read operation is performed by, e.g., applying a voltage pulse to a selected variable resistance element 33, and detecting an electric current determined by the resistance of the memory cell MC. The voltage pulse desirably has a very small amplitude by which the material forming the variable resistance element 33 causes no state change.

For example, the data read operation is performed by applying a read voltage from the bit line BLj to a selected memory cell MC, and measuring the cell current level by the sense amplifier 13.

<Data Erase Operation<Resetting Operation)>

A data erase operation is performed by Joule-heating a selected variable resistance element 33 with a large-current pulse, thereby accelerating a redox reaction in the variable resistance element 33.

1-4. Configuration Example of Memory Cell

An example of the configuration of the memory cell MC according to this embodiment will be explained below with reference to FIG. 4. As shown in FIG. 4, the memory cell MC according to this embodiment has a structure in which the variable resistance element 33 and diode 34 are stacked between the bit line BLj and word line WLi. The variable resistance element 33 has a structure in which a recording layer 30, heater layer 31, and protective layer 32 are sequentially stacked on the diode 34.

1-5. Three-Dimensional Configuration Example of Memory Cell Array

Figure 5:
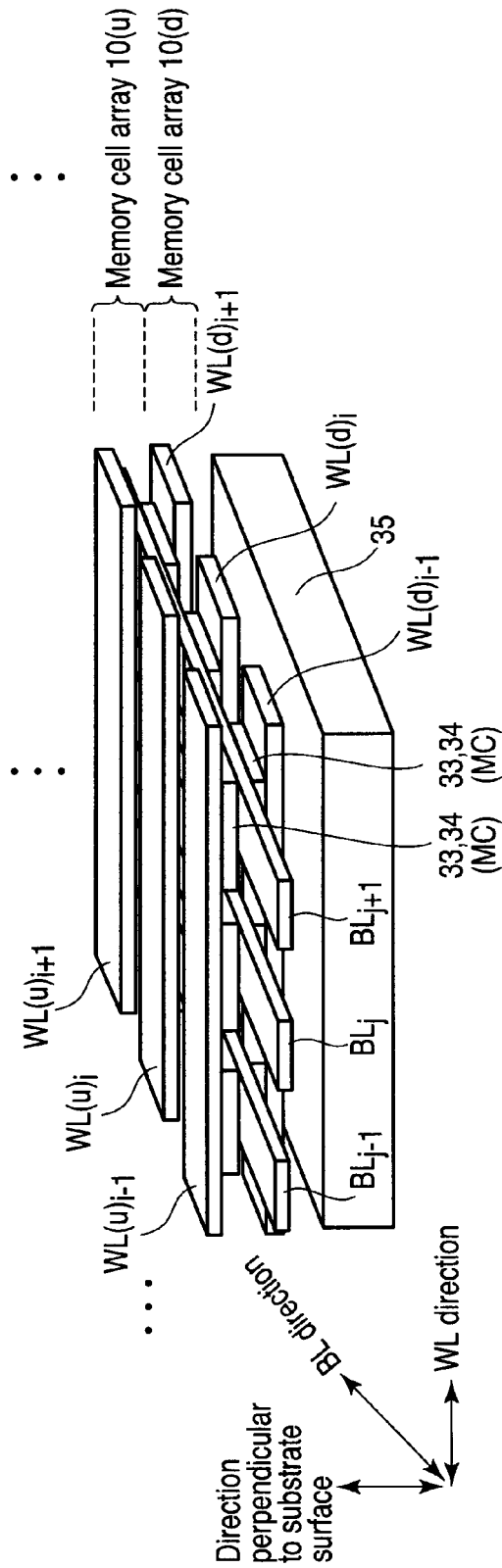
FIG. 5 is a perspective view showing the three-dimensional structure of the memory cell array.

An example of the three-dimensional configuration of the memory cell array 10 according to this embodiment will be explained below with reference to FIG. 5. As shown in FIG. 5, the memory cell array 10 according to this embodiment has a three-dimensional structure in which a plurality of layers (a memory cell array 10(d), memory cell array 10(u), . . . ) are stacked in a direction perpendicular to the substrate surface of a semiconductor substrate 35.

For example, in this embodiment as shown in FIG. 5, a plurality of memory cell arrays 10 are stacked in the direction perpendicular to the substrate surface of the semiconductor substrate 35. More specifically, in the direction perpendicular to the substrate surface of the semiconductor substrate 35, the first memory cell array 10(d) is formed at the intersections of word lines (WLi−1(d), WLi(d), and WLi+1(d)) and the bit lines (BLj−1, BLj, and BLj+1). In addition, the second memory cell array 10(u) is formed at the intersections of word lines (WLi−1(u), WLi(u), and WLi+1(u)) and the bit lines (BLj−1, BLj, and BLj+1).

As described above, the memory cell array 10 according to this embodiment has the three-dimensional structure in which the plurality of layers (the memory cell array 10(d), memory cell array 10(u), . . . ) are stacked in the direction perpendicular to the substrate surface of the semiconductor substrate 35. This is advantageous in increasing the capacity when compared to, e.g., a memory cell array having a two-dimensional structure in which only one layer is formed on a semiconductor substrate.

Note that the present invention is not limited to this, and it is also possible to form a three-dimensional structure by stacking three, four, . . . , and more memory cell arrays 10. Although not shown, a selection transistor for selecting one of the stacked memory cell arrays (the memory cell array 10(d), memory cell array 10(u), . . . ) is formed on the semiconductor substrate 35.

1-6. Configuration Example of Data Input/Output Circuit

An example of the configuration of the data input/output circuit 40 according to this embodiment will be explained below with reference to FIG. 6. The data input/output circuit 40 according to this embodiment has a circuit configuration favorable to simultaneously access the upper column gate 12-1 and lower column gate 12-2 of the two-column configuration. Note that the data input/output circuit 40 according to this embodiment includes address buffers (CA1 and CA2) and hence controls not only the input/output of data but also the input/output of addresses and the like associated with the data.

Figure 6:
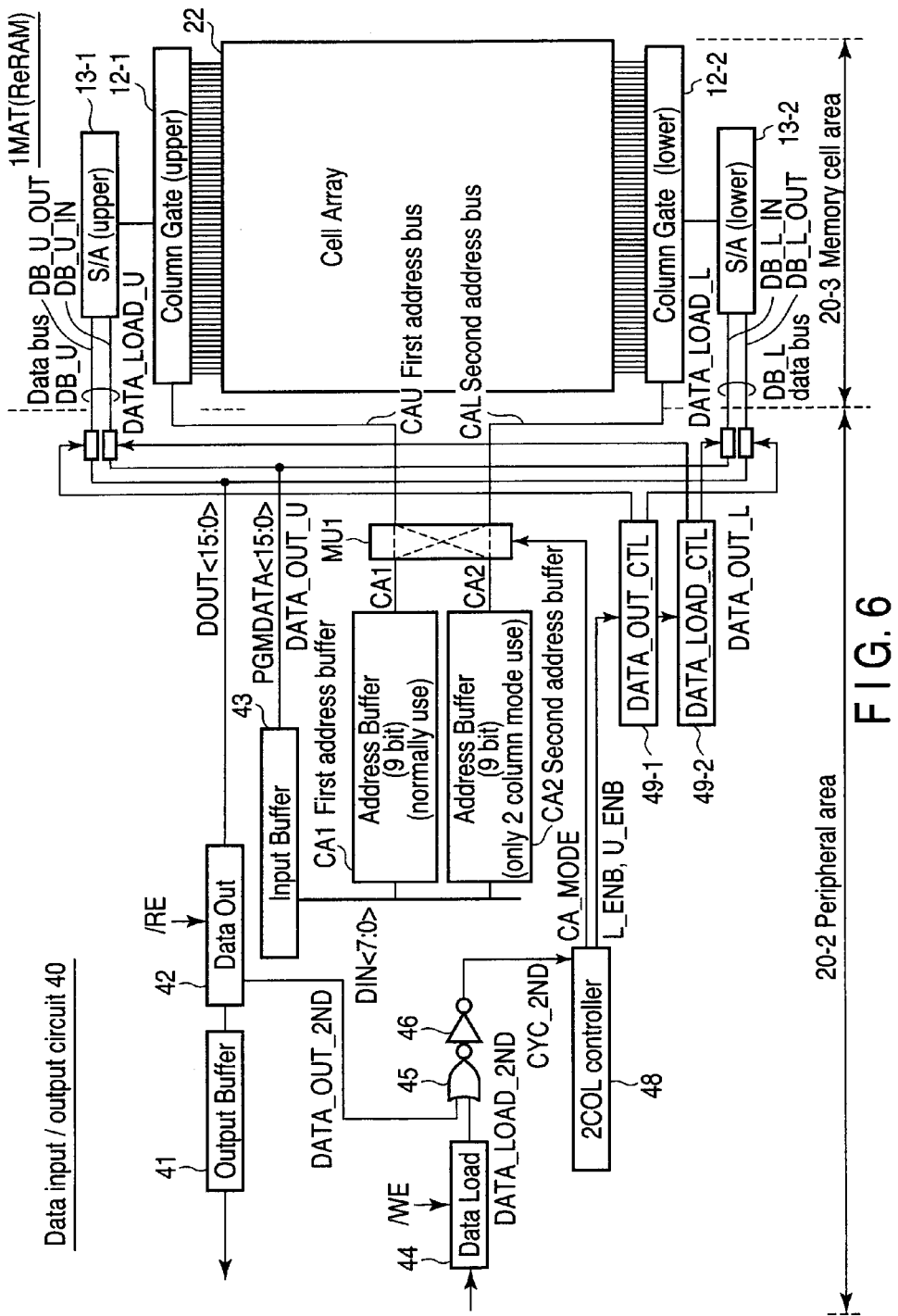
FIG. 6 is a view showing a data input/output circuit and one MAT according to the first embodiment.

As shown in FIG. 6, the data input/output circuit 40 includes first and second address buffers CA1 and CA2, first and second address buses CAU and CAL, a 2COL controller 48, a multiplexer MU1, an output buffer 41, a data output circuit 42, an input buffer 43, a data loading circuit 44, a NOR circuit 45, an inverter 46, a data output switching controller 49-1, and a data loading switching controller 49-2. The data input/output circuit 40 is formed in the peripheral area 20-2.

The first and second address buffers CA1 and CA2 have input terminals connected to the input buffer 43, and output terminals connected to the first and second address buses CAU and CAL via the multiplexer MU1. As will be described later, the first address buffer CA1 is used in a normal mode under the control of the 2COL controller 48. The second address buffer CA2 is used in only a two-column mode under the control of the 2COL controller 48.

The first and second address buses CAU and CAL connect column addresses transferred from the first and second address buffers CA1 and CA2 to the column gates 12-1 and 12-2.

The 2COL controller 48 receives an output (CYC_2ND) from the inverter 46, and outputs, to the multiplexer MU1, a control signal (CA_MODE) for selecting whether to connect the column addresses held in the first and second address buffers CA1 and CA2 to the first or second address bus CAU or CAL. As described above, the first and second address buffers CA1 and CA2 are not dedicated for the upper and lower sides, respectively; the 2COL controller 48 determines, based on an input address, whether to connect the first address buffer CA1 to the first address bus CAU or second address bus CAL, thereby selectively transferring an appropriate address.

In accordance with the control signal (CA_MODE), the multiplexer MU1 selectively outputs the column addresses held in the first and second address buffers CA1 and CA2 to the first or second address bus CAU or CAL.

The output buffer 41 receives a read enable signal /RE, and outputs readout data. The output buffer 41 is electrically connected to an I/O pad, and outputs data read out from the cell array 22.

The data output circuit 42 outputs a signal DATA_OUT_2ND in accordance with the number of cycles of /RE. This signal changes into the signal CYC_2ND for time-division control via an OR circuit. L_ENB and U_ENB are changed in accordance with the number of cycles and an address stored in CA2, and a data output bus DOUT is time-divisionally connected to DB_L or DB_U.

The input buffer 43 outputs a write data bus PGM-DATA<15:0> and data input bus DIN<7:0>. The DIN<7:0> is input to the address buffer or command buffer. The write data bus PGMDATA<15:0> is connected to a transfer gate for transfer to DB_U or DB_L.

The data loading circuit 44 counts the number of write enable signals /WE, and outputs a signal DATA_LOAD_2ND indicating the count.

The output terminal of the NOR circuit 45 is connected to the input terminal of the inverter 46. The output terminal (CYC_2ND) of the inverter 46 is connected to the 2COL controller 48.

When receiving the control signal (L_ENB or U_ENB) from the 2COL controller 48, the data output switching controller 49-1 controls a switch to connect the data bus DB_U or DB_L to the data output DOUT.

When receiving the control signal (L_ENB or U_ENB) from the 2COL controller 48, the data loading switching controller 49-2 controls a switch to connect the data bus DB_U or DB_L to a write data bus PGMDATA.

The (upper) data bus DB_U includes an input bus DB_U_IN and output bus DB_U_OUT respectively connected to the input and output of the (upper) sense amplifier 13-1.

The (lower) data bus DB_L includes an input bus DB_L_IN and output bus DB_L_OUT respectively connected to the input and output of the (lower) sense amplifier 13-2.

As described above, the data input/output circuit 40 according to this embodiment includes the first and second address buffers CA1 and CA2, and also includes the first and second address buses CAU and CAL for transferring the first and second address buffers CA1 and CA2 to the column gates 12-1 and 12-2.

In addition, the input buses (DB_U_IN and DB_L_IN) and output buses (DB_U_OUT and DB_L_OUT) of the data buses (DB_U and DB_L) are respectively connected together to the sense amplifiers 13-1 and 13-2.

In accordance with the timing control signals (CA_MODE, L_ENB, and U_ENB) output from the 2COL controller 48, the outputs of the multiplexer MU1 are switched by CA_MODE in the address system. When loading or outputting data, CA1 is transferred to CAL and CAU in the first cycle and CA2 is transferred to CAL and CAU in the second cycle by time-division control. In a busy period as a cell access period, CA1 and CA2 are transferred such that CAL=CA1 and CAU=CA2, or CAL=CA2 and CAU=CA1, in accordance with whether the address of CA2 is lower or upper. In the data system, L_ENB or U_ENB controls a switching circuit adjacent to S/A, thereby switching the data buses for data loading and output. Details of the operation will be described later.

1-7. Configuration Example of Column Gate

An example of the configuration of the column gate according to this embodiment will be explained below with reference to FIG. 7. In the following explanation, the (upper) column gate 12-1 will be taken as an example.

Figure 7:
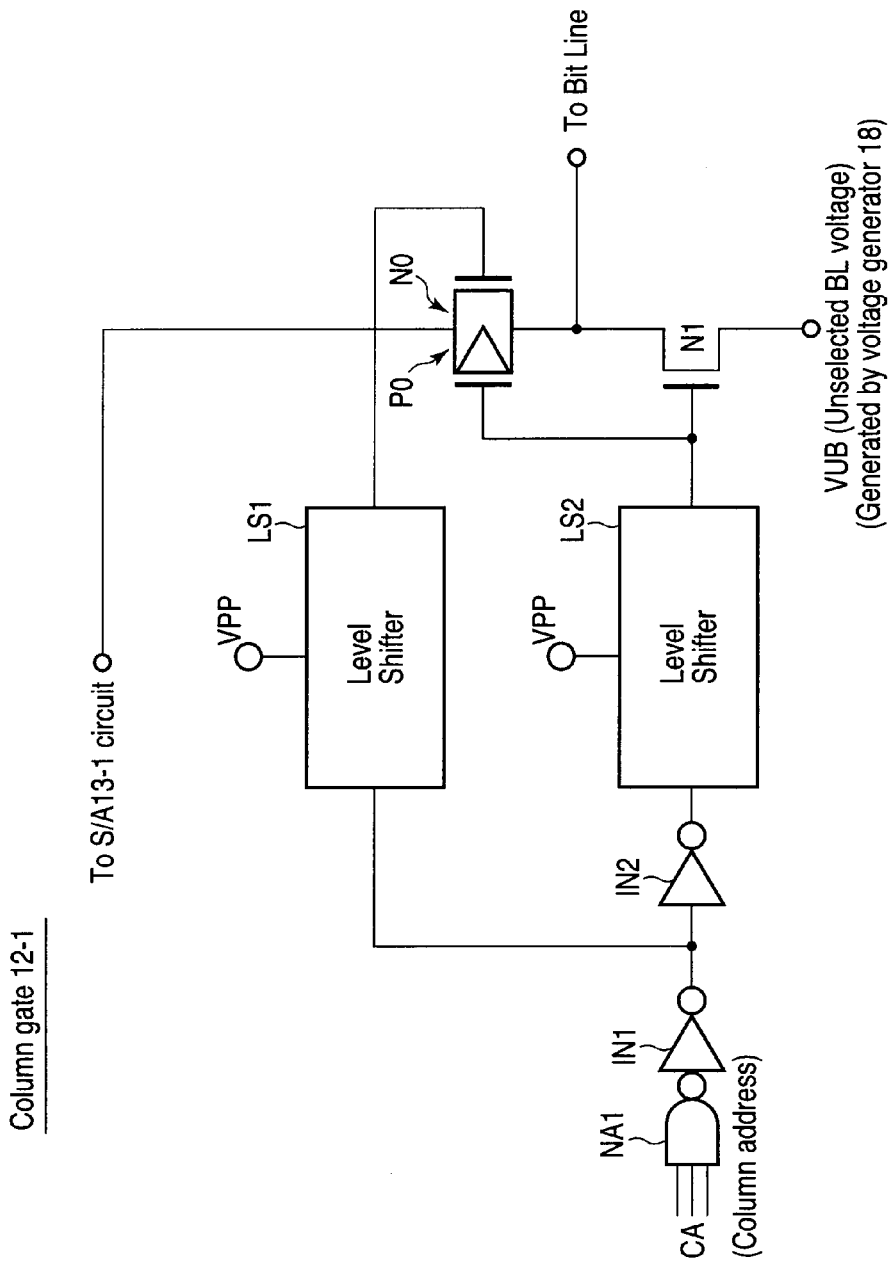
FIG. 7 is an equivalent circuit diagram showing a column gate according to the first embodiment.

As shown in FIG. 7, the column gate 12-1 according to this embodiment includes a NAND circuit NA1, inverters IN1 and IN2, level shifters LS1 and LS2, and transistors N0, P0, and N1.

A column address (CA) is input to the input terminal of the NAND circuit NA1, and output to the input terminal of the inverter IN1.

The output terminal of the inverter IN1 is connected to the input terminal of the level shifter LS1 and the input terminal of the inverter IN2. The output terminal of the inverter IN2 is connected to the input terminal of the level shifter LS2.

The level shifter LS1 converts a decoded signal of the column address CA into a logic signal of an internal power supply voltage VPP by voltage conversion, thereby controlling the gate of the transistor N0.

The level shifter LS2 converts the decoded signal of the column address CA into the logic signal of the internal power supply voltage VPP by voltage conversion, thereby controlling the gates of the transistors P0 and N1.

The current path of the transistor P0 has one end connected to the sense amplifier 13-1, and the other end connected to a bit line. The current path of the transistor N0 has one end connected to the sense amplifier 13-1, and the other end connected to a bit line. The current path of the transistor N1 has one end connected to a bit line, and the other end connected to a voltage VUB (generated by the voltage generator 18) of an unselected bit line. The gate of the transistor N1 is connected to the gate of the transistor P0 and the output terminal of the level shifter LS2.

1-8. Configuration Example of Sense Amplifier

An example of the configuration of the sense amplifier according to this embodiment will be explained below with reference to FIG. 8. In this explanation, the (upper) sense amplifier 13-1 will be taken as an example. As shown in FIG. 8, the sense amplifier 13-1 according to this embodiment includes an inverter IN3, current mirror circuit 50, current source I1, transistor N2, operational amplifier OP1, and latch circuit L1.

The inverter IN3 has an input terminal to which a column selection signal (L_ENB) output from the 2COL controller 48 is input, and an output terminal connected to the current mirror circuit 50.

The current mirror circuit 50 includes PMOS transistors P1 to P4. The transistors P1 and P2 control the activation and deactivation of the current mirror circuit. One end of the current path of each of the transistors P1 and P2 is connected to a set voltage VSET, and the gates of the transistors P1 and P2 are connected to the output terminal of the inverter IN3. One end of the current path of the transistor P3 is connected to the other end of the current path of the transistor P1, and the other end of the current path and the gate of the transistor P3 are connected. The current path of the transistor P4 has one end connected to the other end of the current path of the transistor P2, and the other end connected to one end of the current path of the transistor N2. The gate of the transistor P4 is connected to that of the transistor P3. In this manner, the current mirror circuit is formed.

The current source I1 has an input terminal connected to the other end of the current path of the transistor P3, and an output terminal connected to a reference voltage source VSS, and generates a reference current IREF.

The transistor N2 clamps the bit-line level. The current path of the transistor N2 has one end connected to the input terminal of the operational amplifier OP1, and the other end connected to the column gate 12-1. A voltage VCLAMP is applied to the gate of the transistor N2.

The operational amplifier OP1 has an input terminal to which the reference voltage VREF is applied, and an output terminal connected to the input terminal of the latch circuit L1.

The output terminal of the latch circuit L1 is connected to the data bus DB_U.

2. Control Operation 2-0. Control Sequence

Figure 9:
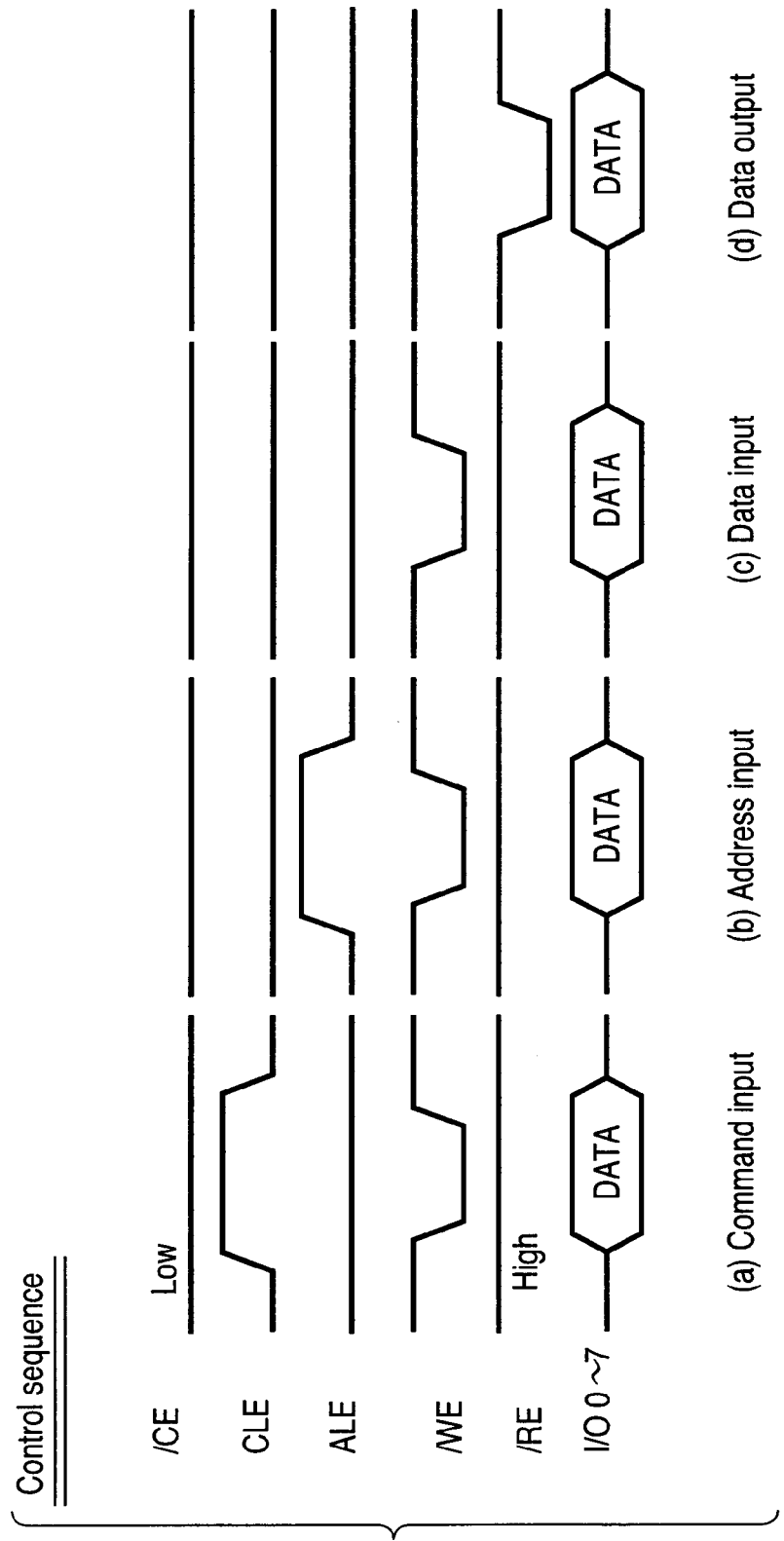
FIG. 9 is a view showing the control sequence of the semiconductor memory device according to the first embodiment.

The control sequence of the semiconductor memory device according to this embodiment will now be explained with reference to FIG. 9. The control sequence shown in FIG. 9 corresponds to a NAND interface complying with a NAND flash memory. Note that in this explanation, a chip enable signal /CE is always "Low", so an explanation thereof will be omitted.

In (a) command input, a command latch enable signal CLE is "High", an address latch enable signal ALE is "Low", the write enable signal /WE is "Low", the read enable signal /RE is "High", and a command is input to the I/O pins 0 to 7.

In (b) address input, the command latch enable signal CLE is "Low", the address latch enable signal ALE is "High", the write enable signal /WE is "Low", the read enable signal /RE is "High", and an address is input from the I/O pins 0 to 7.

In (c) data input, the command latch enable signal CLE is "Low", the address latch enable signal ALE is "Low", the write enable signal /WE is "Low", the read enable signal /RE is "High", and data is input from the I/O pins 0 to 7.

In (d) data output, the command latch enable signal CLE is "Low", the address latch enable signal ALE is "Low", the write enable signal /WE is "High", the read enable signal /RE is "Low", and data is output from the I/O pins 0 to 7.

2-1. Control Sequence in Normal Mode

Figure 10:
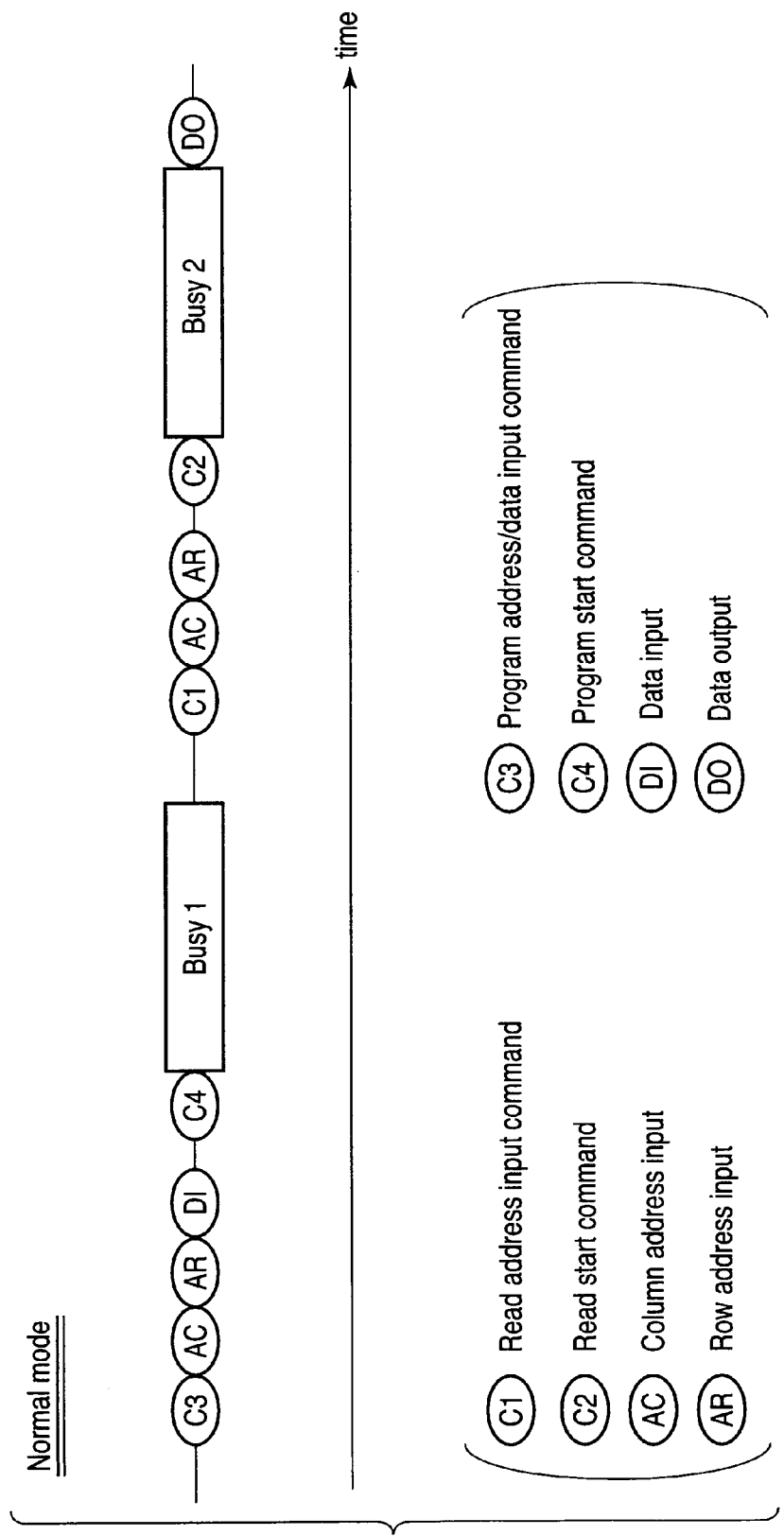
FIG. 10 is a view showing the control sequence in a normal mode of the semiconductor memory device according to the first embodiment.

The control sequence of data write and data read in the normal mode of the semiconductor memory device according to this embodiment will be explained below with reference to FIG. 10.

2-1-1. Data Write ("Programming")

First, input data is written in a memory cell (a busy state: Busy 1) when a data write (programming) address/data input command C3, column address AC, row address AR, (write) data input DI, and data write (programming) start input command C4 are sequentially input.

2-1-2. Data Read ("Read")

Subsequently, data is read out from a memory cell (a busy state: Busy 2) when a data read address/data input command C1, the column address AC, the row address AR, and a data read start input command C2 are sequentially input, and data output DO is performed.

2-2. Two-Column Mode (1)

Figure 11:
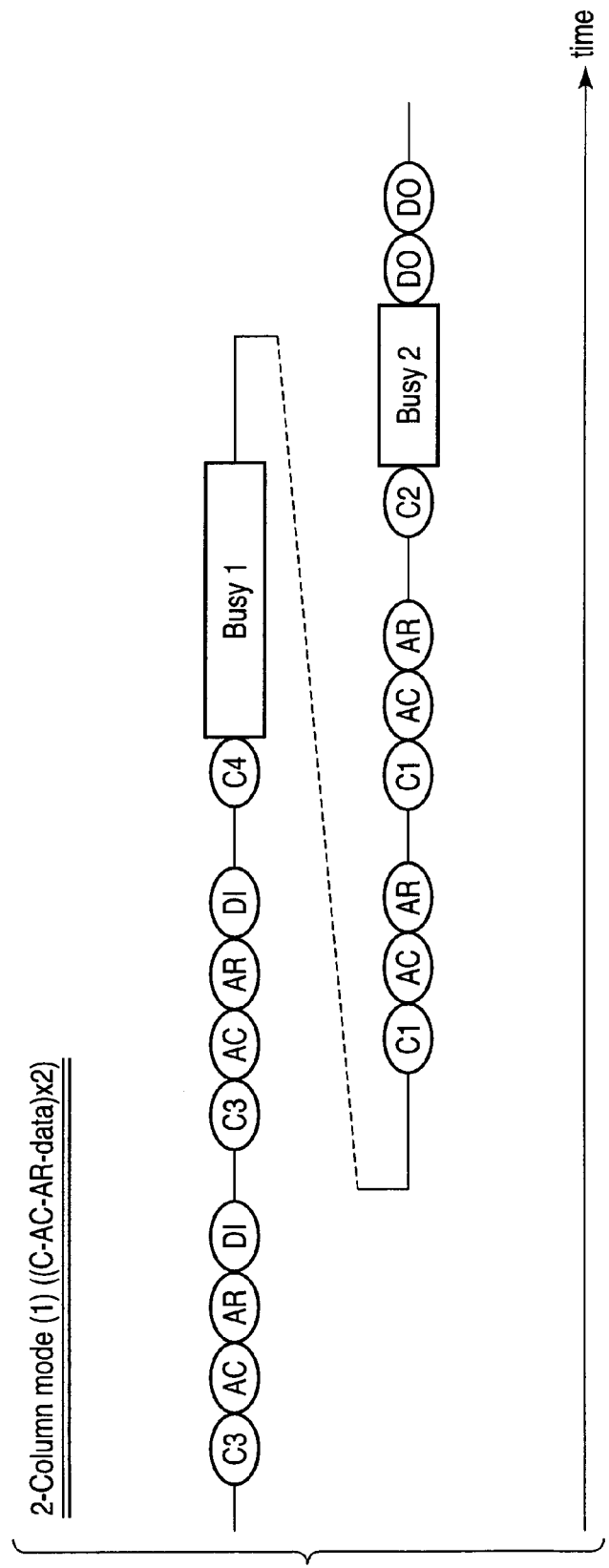
FIG. 11 is a view showing the control sequence in two-column mode (1) of the semiconductor memory device according to the first embodiment.

The control sequence in two-column mode (1) of the semiconductor memory device according to this embodiment will be explained below with reference to FIG. 11. As shown in FIG. 11, two data input/output control sequences repeat a unit (command+column address+row address+data (C–AC–AR–data)) twice.

2-2-1. Data Write ("Programming")

That is, input data are written in memory cells (Busy 1) when a unit [the data write address/data input command C3, column address AC, row address AR, and data input DI], another unit [the data write address/data input command C3, column address AC, row address AR, and data input DI], and the data write start input command C4 are sequentially input. Operation of Data Input/Output Circuit 40 in Data Write ("Programming")

In data write ("programming") in the two-column mode according to this embodiment as described above, two addresses and two data are input by repeating the unit [command+address input+data input] twice.

In the first sequence of the unit, an address stored in the first address buffer CA1 is transferred to the first address bus CAU. In the second sequence of the unit, an address stored in the second address buffer CA2 is transferred to the second address bus CAL.

When the data write start command C4 is input after that, the memory cell array 10 is set in an access state. In this state, two addresses are simultaneously transferred to the first and second address buses CAL and CAU.

The control signal (CA_MODE) output from the 2COL controller 48 controls which of data stored in the first and second address buffers CA1 and CA2 is to be transferred to the first and second address buses CAL and CAU as follows.

When an address stored in the second address buffer CA2 is on the lower side, data to be transferred to the first and second address buses CAU and CAL respectively correspond to data stored in the first and second address buffers CA1 and CA2 (CAL=CA2 and CAU=CA1).

On the other hand, when an address stored in the second address buffer CA2 is on the upper side, data to be transferred to the first and second address buses CAU and CAL respectively correspond to data stored in the second and first address buffers CA2 and CA1 (CAL=CA1 and CAU=CA2).

In the above case, it is, of course, also possible to make the determination by an address stored in the first address buffer CA1. However, making the determination by an address stored in the second address buffer CA2 has the advantage that if a lower address or upper address enters both the first and second address buffers CA1 and CA2, an operation error by which the sense amplifiers 13-1 and 13-2 are overwritten with "the second data" can be prevented. As described above, it is possible to prevent an operation error and perform a normal operation regardless of whether a lower address or upper address enters both the first and second address buffers CA1 and CA2.

2-2-2. Data Read ("Read")

Data are read out from memory cells (Busy 2) when a unit [the data read address/data input command C1, column address AC, and row address AR], another unit [the data read address/data input command C1, column address AC, and row address AR], and the data read start input command C2 are sequentially input, and the data are output from the I/O pins by inputting the data output waveform DO twice.

Operation of Data Input/Output Circuit 40 in Data Read ("Read")

In data read as described above, the data output DO (×2) is performed in a ready state after the busy state (Busy 2) when "read" is complete.

In the busy state, two addresses are simultaneously transferred to the first and second address buses CAL and CAU. After that, the first and second address buses CAL and CAU return to the time-division mode again in the ready state.

In the first data output DO, an address stored in the first address buffer CA1 is transferred to CAU and CAL, and whether an address stored in the second address buffer CA2 is lower or upper is determined. The data bus DOUT is connected to the upper S/A if the address is lower, and connected to the lower S/A if the address is upper, and the S/A data is output outside. In the second data output DO, an address stored in the second address buffer CA2 is transferred to CAU and CAL. The data bus DOUT is connected to the lower S/A if the address is lower, and connected to the upper S/A if the address is upper, and the S/A data is output outside.

As described above, the address input control method (two-column mode) of 2-2. can implement the two-column simultaneous access mode and data access mode. This makes the method advantageous in that the column addresses CA1 and CA2 can independently be set. The method is also advantageous in increasing the speed of access to a memory cell because two-column simultaneous access is possible.

2-3. Two-Column Mode (2)

Figure 12:
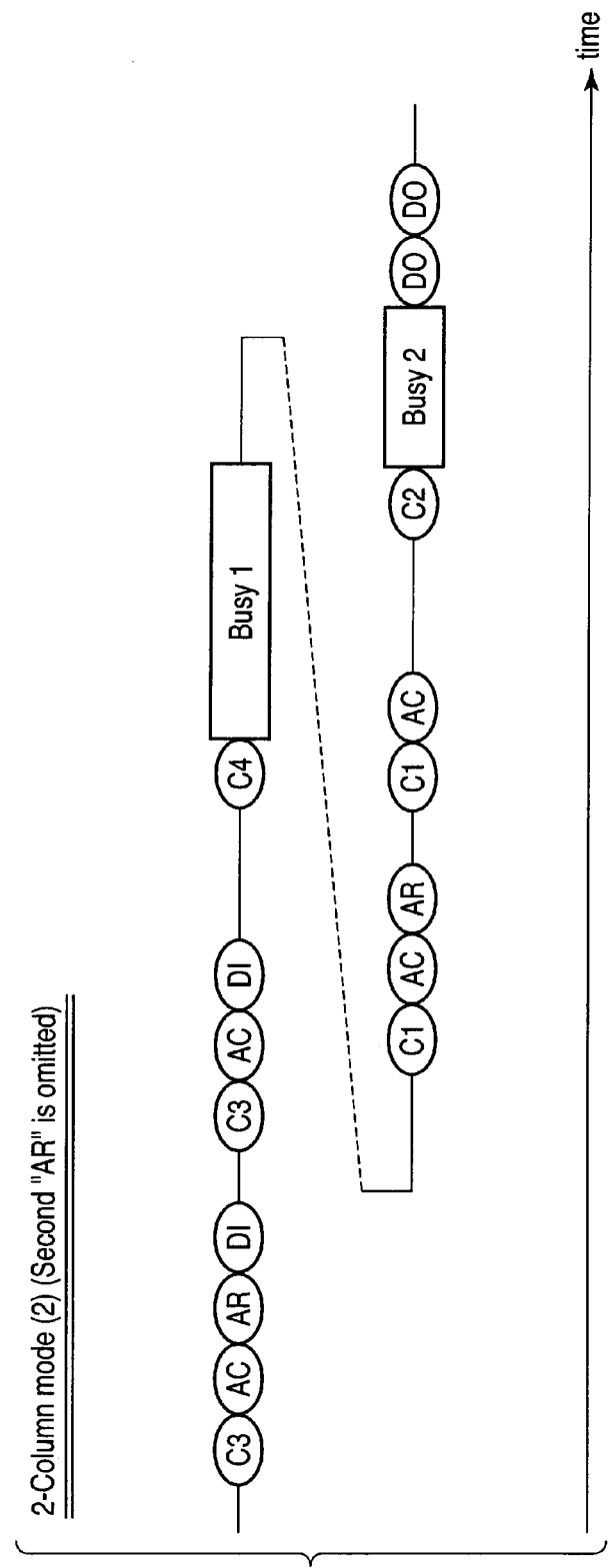
FIG. 12 is a view showing the control sequence in two-column mode (2) of the semiconductor memory device according to the first embodiment.

The control sequence in two-column mode (2) of the semiconductor memory device according to this embodiment will be explained below with reference to FIG. 12. As shown in FIG. 12, this sequence is an address/data input method as a variation of 2-2. described above. That is, although a row address is input twice in 2-2., only one row address is input in this mode, so the same row address must be used for the second input. Also, a row address is omitted (the row address AR is omitted in the second time) in 2-3.

2-3-1. Data Write ("Programming")

More specifically, input data are written in memory cells (Busy 1) when [the data write address/data input command C3, column address AC, row address AR, and data input DI], [the data write address/data input command C3, column address AC, and data input DI], and the data write start input command C4 are sequentially input.

2-3-2. Data Read ("Read")

Data are read from memory cells (Busy 2) when [the data read address/data input command C1, column address AC, and row address AR], [the data read address/data input command C1 and column address AC], and the data read start input command C2 are input, and the data are output DO (×2).

2-4. Two-Column Mode (3)

Figure 13:
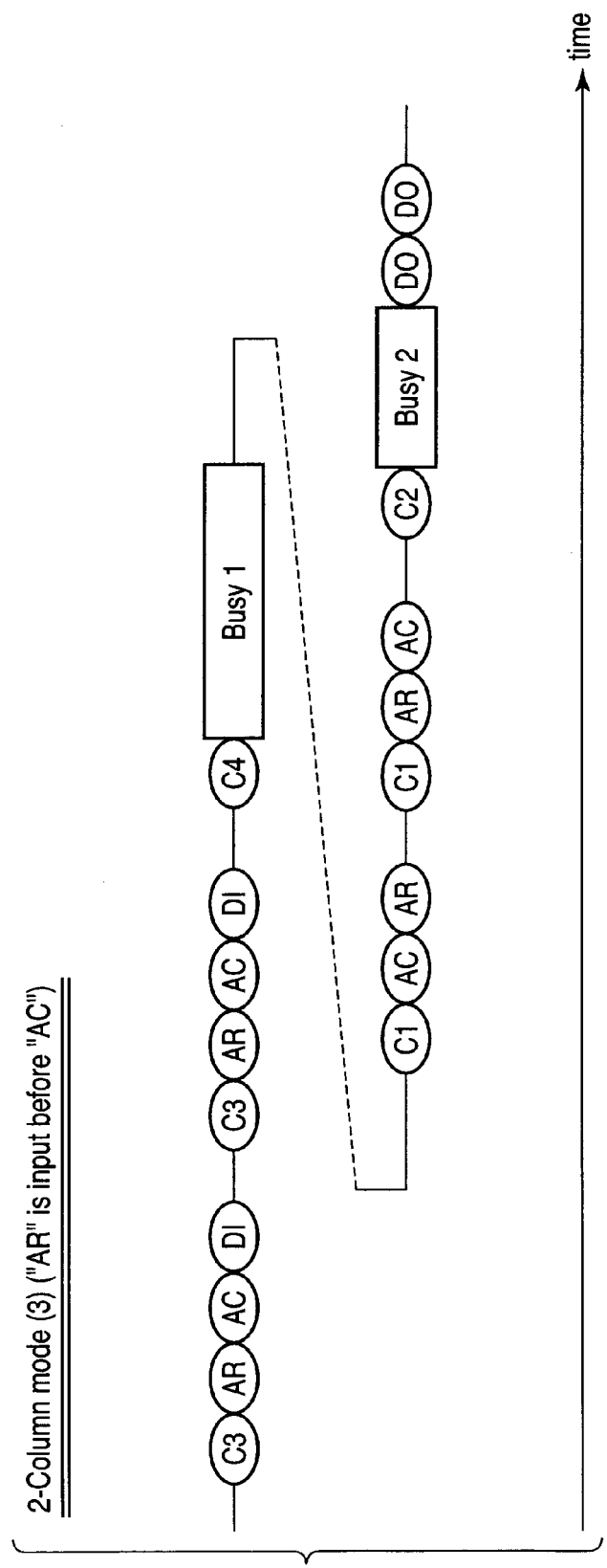
FIG. 13 is a view showing the control sequence in two-column mode (3) of the semiconductor memory device according to the first embodiment.

The control sequence in two-column mode (3) of the semiconductor memory device according to this embodiment will be explained below with reference to FIG. 13. As shown in FIG. 13, this sequence is a variation of 2-2. described above. In this sequence, the input order of the row address and column address is changed (the row address AR is input before the column address AC).

2-4-1. Data Write ("Programming")

More specifically, input data are written in memory cells (Busy 1) when a unit [the data write address/data input command C3, row address AR, column address AC, and data input DI], another unit [the data write address/data input command C3, row address AR, column address AC, and data input DI], and the data write start input command C4 are sequentially input.

2-4-2. Data Read ("Read")

Data are read out from memory cells (Busy 2) when a unit [the data read address/data input command C1, row address AR, and column address AC], another unit [the data read address/data input command C1, row address AR, and column address AC], and the data read start input command C2 are sequentially input, and the data are output DO (×2).

<3. Effects>

The semiconductor memory device and the control method of the same according to the first embodiment achieve at least effects (1) to (4) below.

(1) The speed of access to the memory cell MC is advantageously increased.

As described above, the semiconductor memory device according to this embodiment includes the plurality of memory cells MC, and the plurality of memory cell arrays 10 stacked on the semiconductor substrate 35 to form a three-dimensional structure.

The semiconductor memory device also includes the data input/output circuit 40 including the first address buffer CA1 for storing the first address of the plurality of memory cell arrays, the second address buffer CA2 for storing the second address of the plurality of memory cell arrays, and the controller 48 for performing control so as to input the first and second addresses CA1 and CA2 to or output them from the first and second address buses CAU and CAL by time-division control (e.g., FIG. 9) in data input/output.

Accordingly, as explained in, e.g., the address input control method (two-column mode) of 2-2. described above, the two-column simultaneous access mode and data access mode can be implemented for the memory cells MC to be randomly accessed. Since the two columns can simultaneously be accessed, the speed of access to the memory cells MC is advantageously increased.

Furthermore, in this embodiment, the ReRAM to be randomly accessed complies with the NAND interface. Therefore, a plurality of columns of the ReRAM can be accessed by an input method complying with the NAND interface.

This advantageously makes it possible to reduce the number of pins, and time-divisionally input and output addresses.

(2) It is possible to independently set the first and second column addresses CA1 and CA2, and prevent an operation error.

The control signal (CA_MODE) output from the 2COL controller 48 controls which of data stored in the first and second address buses CA1 and CA2 is to be transferred to the first and second address buses CAL and CAU as follows.

When an address stored in the second address buffer CA2 is on the lower side, data to be transferred to the first and second address buses CAU and CAL respectively correspond to data stored in the first and second address buffers CA1 and CA2 (CAL=CA2 and CAU=CA1).

On the other hand, when an address stored in the second address buffer CA2 is on the upper side, data to be transferred to the first and second address buses CAU and CAL respectively correspond to data stored in the second and first address buffers CA2 and CA1 (CAL=CA1 and CAU=CA2).

In the above case, it is, of course, also possible to make the determination by an address stored in the first address buffer CA1. However, making the determination by an address stored in the second address buffer CA2 has the advantage that if a lower address or upper address enters both the first and second address buffers CA1 and CA2, an operation error by which the sense amplifiers 13-1 and 13-2 are overwritten with "the second data" can be prevented.

As described above, the embodiment is advantageous in that it is possible to independently set the first and second column addresses CA1 and CA2 and prevent an operation error regardless of whether a lower address or upper address enters both the first and second address buffers CA1 and CA2.

(3) Two or more different addresses can simultaneously be accessed.

As described above, addresses can independently be input in the arrangement and its control operation according to this embodiment. This is advantageous in that two or more different addresses can simultaneously be accessed.

(4) Power dispersion is possible.

In the arrangement and its control operation according to this embodiment as described above, the lower column gate 12-1 and upper column gate 12-2 simultaneously access the memory cell array 10. This seems to be equivalent to increasing the number of bits to be accessed. Since, however, addresses can independently be designated, entirely different positions can be accessed. Although the power supply voltage easily drops in a memory in which the current consumption is large, this embodiment can improve this problem because positions to be accessed can be separated. Accordingly, the embodiment is advantageous in that power dispersion is possible.

[Second Embodiment (Example Including No Second Address Buffer)]

Figure 15:
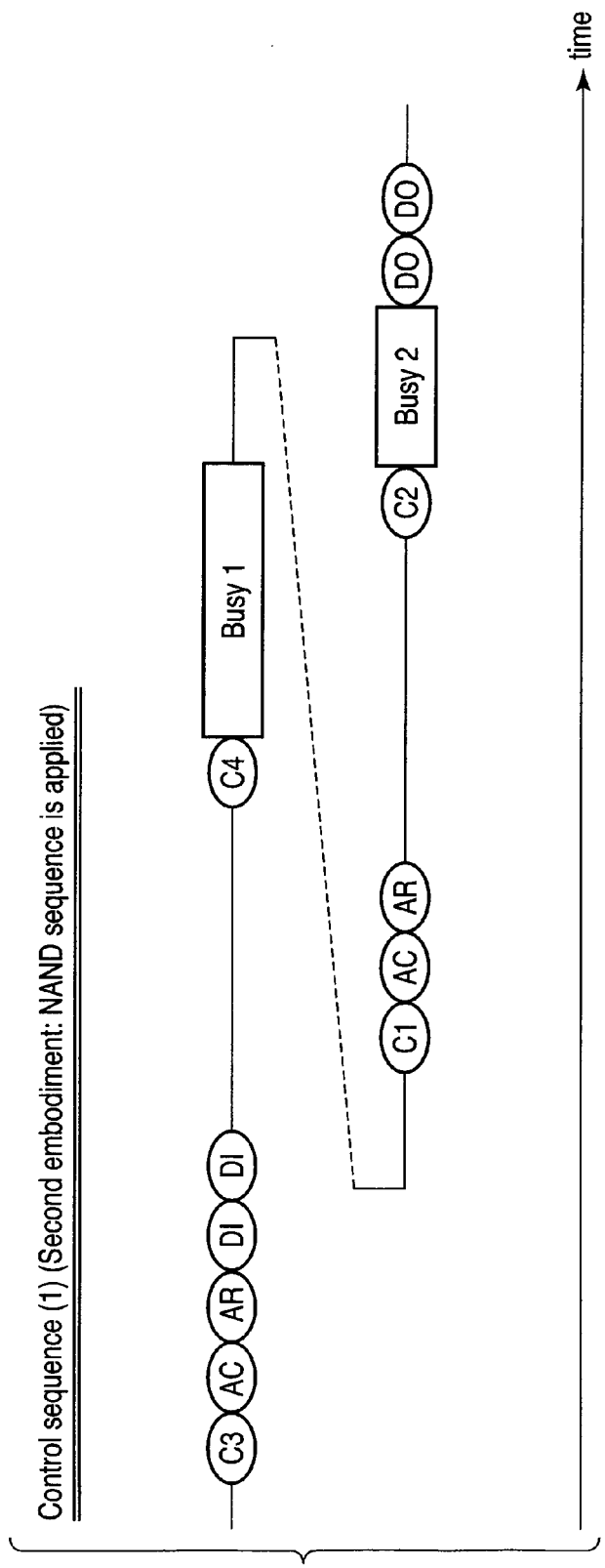
FIG. 15 is a view showing control sequence (1) of a semiconductor memory device according to the second embodiment.
Figure 16:
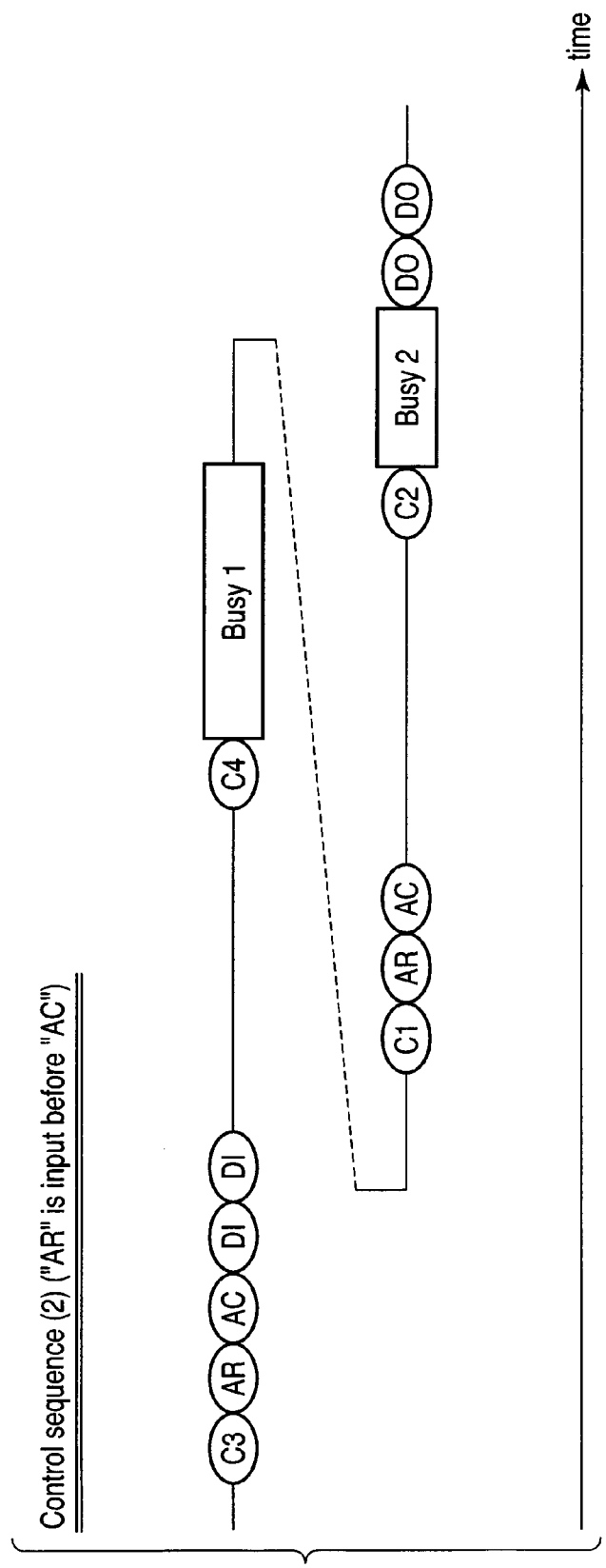
FIG. 16 is a view showing control sequence (2) of a semiconductor memory device according to the second embodiment.

A semiconductor memory device and a control method of the same according to the second embodiment will be explained below with reference to FIGS. 14 to 16. This embodiment is directed to an example including no second address buffer CA2. In this explanation, a repetitive explanation of the same portions as in the above-mentioned first embodiment will be omitted.

<Configuration Example>

First, an example of the configuration of the semiconductor memory device according to the second embodiment will be explained below with reference to FIG. 14.

Figure 14:
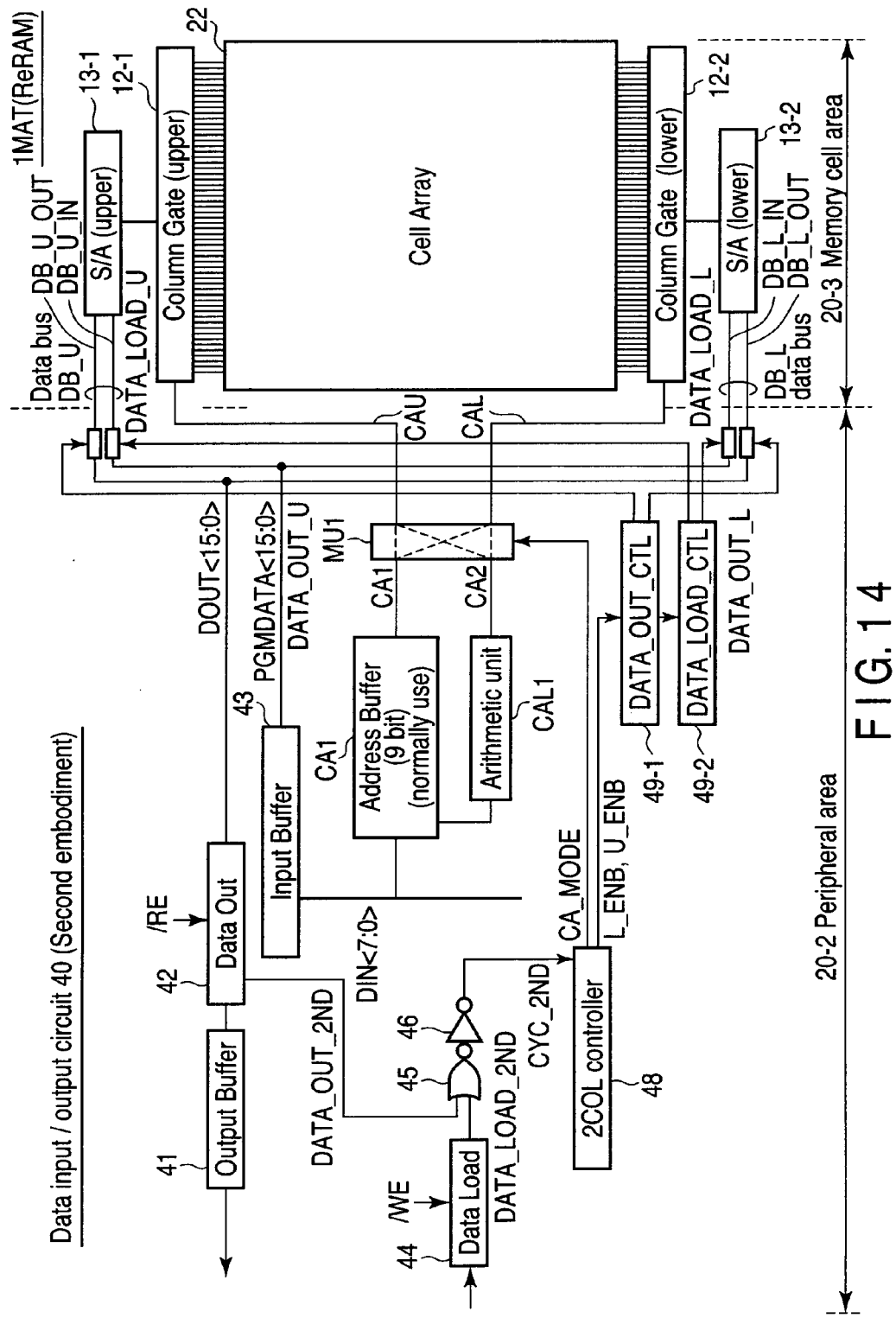
FIG. 14 is a view showing a data input/output circuit and one MAT according to the second embodiment.

As shown in FIG. 14, the semiconductor memory device according to this embodiment differs from the first embodiment in that a data input/output circuit 40 includes no second address buffer CA2 and further includes an arithmetic unit CAL1.

The arithmetic unit CAL1 uniquely determines a column address corresponding to the above-mentioned second column address (CA2) from the value of a first column address CA1 by using a predetermined operation expression.

In the configuration of this embodiment, therefore, no command need be input before data input/output, so "the NAND sequence" complying with the NAND interface is directly applicable. This will be explained in more detail below.

<Control Operation>

Control Sequence (1) (NAND Sequence)

Control sequence (1) of the semiconductor memory device according to this embodiment will be explained below with reference to FIG. 15. As shown in FIG. 15, this control sequence is the application of the NAND sequence complying with the NAND interface.

Data Write ("Programming")

More specifically, input data is written in a memory cell (Busy 1) when [a data write address/data input command C3, column address AC, row address AR, data input DI, and data input DI] and a write start command C4 are sequentially input.

Data Read ("Read")

Subsequently, data is read from a memory cell (Busy 2) when [a data read address/data input command C1, the column address AC, and the row address AR] and a data read start input command C2 are sequentially input, and the data is output DO (×2).

Control Sequence (2) ("AR" Is Input before "AC")

Control sequence (2) of the semiconductor memory device according to this embodiment will be explained below with reference to FIG. 16. As shown in FIG. 16, this control sequence differs from control sequence (1) described above in that the row address AR is input before the column address AC.

Data Write ("Programming")

More specifically, input data is written in a memory cell (Busy 1) when [the data write address/data input command C3, row address AR, column address AC, data input DI, and data input DI] and the write start command C4 are sequentially input.

Data Read ("Read")

Subsequently, data is read out from a memory cell (Busy 2) when [the data read address/data input command C1, row address AR, and column address AC] and the data read start input command C2 are sequentially input, and the data is output DO (×2).

<Effects>

As described above, the semiconductor memory device and the control method of the same according to the second embodiment achieve at least the same effects as effects (1) and (2) described earlier.

In addition, this embodiment includes the arithmetic unit CAL1 that uniquely determines a column address corresponding to the second column address (CA2) from the value of the first column address CA1 by using the predetermined operation expression.

Since the second address buffer CA2 is unnecessary, therefore, no command need be input before data input/output, so the NAND sequence complying with the NAND interface is directly applicable. The second embodiment is also advantageous in increasing the access speed because no second command input is necessary. In addition, it is possible to use evaluation resources used in a NAND flash memory and maintain the compatibility of a memory controller. This makes the second embodiment advantageous in reducing the fabrication cost.

[First Modification (Example Including Counter Circuits (+2) and (+2))]

A semiconductor memory device and a control method of the same according to the first modification will be explained below with reference to FIGS. 17 to 22. This modification is directed to an example including counter circuits in first and second address buffers CA1 and CA2. In this explanation, a repetitive explanation of the same portions as in the first embodiment described above will be omitted.

<Configuration Example>

First, an example of the configuration of the semiconductor memory device according to the first modification will be explained below with reference to FIG. 17.

As shown in FIG. 17, the semiconductor memory device according to this modification differs from the aforementioned first embodiment in that the first and second address buffers CA1 and CA2 include first and second counter circuits CO1 (+2) and CO2 (+2).

The counter circuits CO1 (+2) and CO2 (+2) count up (+2), 1 at a time, addresses stored in the first and second address buffers CA1 and CA2. More specifically, whenever a clock /WE is input during data loading or a clock /RE is input during data output, the first and second counter circuits CO1 (+2) and CO2 (+2) count up (+2), 1 at a time, addresses stored in the first and second address buffers CA1 and CA2.

<Control Operation>

A control operation complying with the control sequence of the semiconductor memory device according to this modification will be explained below with reference to FIGS. 18 to 22. This explanation will be made in accordance with a data write operation (a busy state (Busy 1): pgm1, pgm2, pgm3, and pgm4) in the control sequence shown in FIG. 18. A repetitive explanation of the same portions as described previously will be omitted.

Busy State (Busy 1): pgm1

Figure 19:
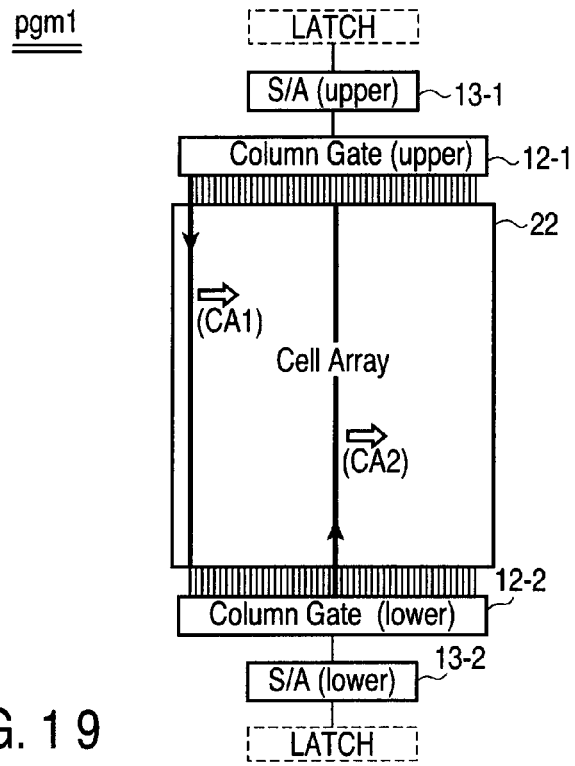
FIG. 19 is a view showing the state of access to memory cells in a busy state.

FIG. 19 shows the state of access to memory cells in this state.

As shown in FIG. 19, the first and second counter circuits CO1 and CO2 count up addresses stored in the first and second address buffers CA1 and CA2 by +2. Therefore, when an address 2K is input to the second address buffer CA2, for example, memory cells are accessed from the left end of a cell array 22 in the upper portion, and from the center of the cell array 22 in the lower portion.

Busy State (Busy 1): pgm2

Figure 20:
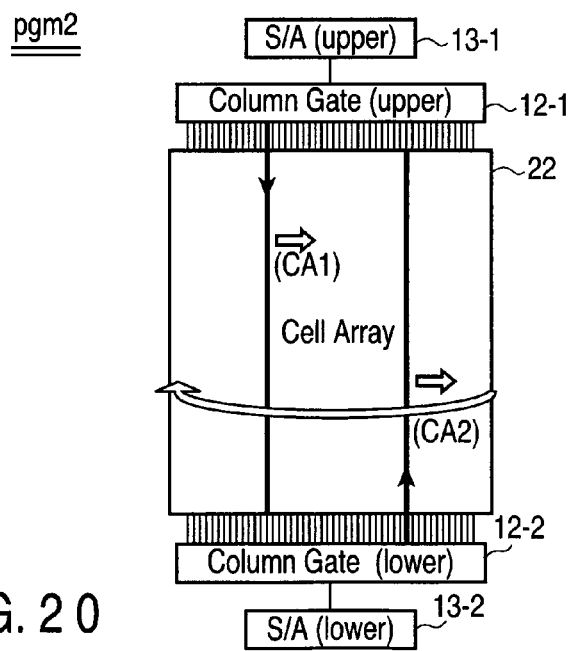
FIG. 20 is a view showing the state of access to memory cells in the busy state shown in FIG. 19.

FIG. 20 shows the state of access to memory cells in this state.

As shown in FIG. 20, memory cells are accessed further from the left end toward the right side of the cell array 22 in the upper portion, and further from the center toward the right side of the cell array 22 in the lower portion. When the access reaches the right end of the cell array 22 in the lower portion, memory cells are accessed from the left end again.

Busy State (Busy 1): pgm3

Figure 21:
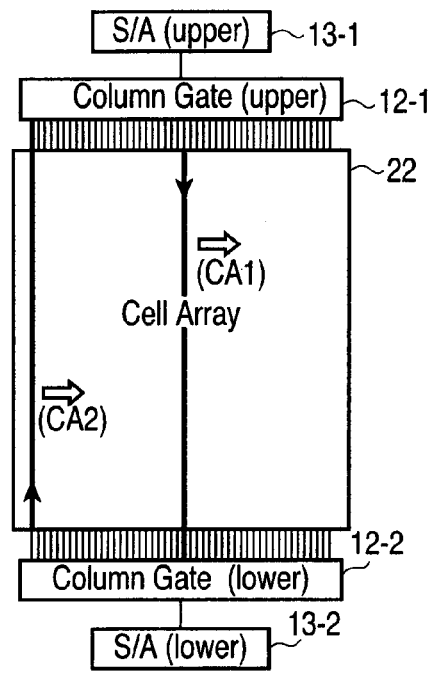
FIG. 21 is a view showing the state of access to memory cells in the busy state shown in FIG. 19.

FIG. 21 shows the state of access to memory cells in this state.

As shown in FIG. 21, memory cells are accessed further from the center toward the right side of the cell array 22 in the upper portion, and further from the left end toward the right side of the cell array 22 in the lower portion.

Busy State (Busy 1): pgm4

Figure 22:
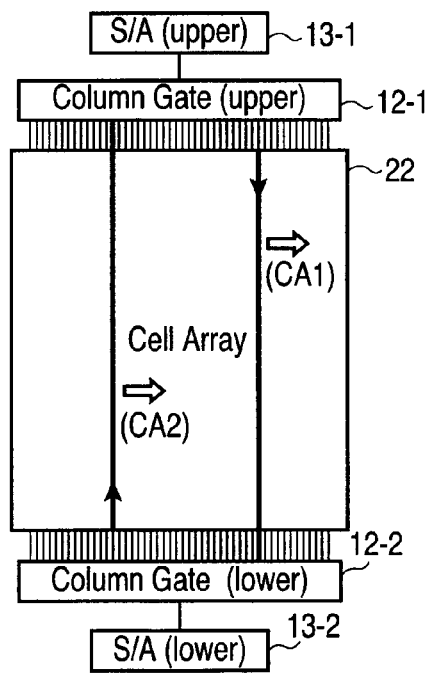
FIG. 22 is a view showing the state of access to memory cells in the busy state shown in FIG. 19.

FIG. 22 shows the state of access to memory cells in this state.

As shown in FIG. 22, memory cells are accessed further toward the right side of the cell array 22 in the upper portion, and further toward the right side of the cell array 22 in the lower portion.

Note that a controller 17 controls the access in this busy state (Busy 1), and changes the access address 2K times (2K cycle).

Figure 18:
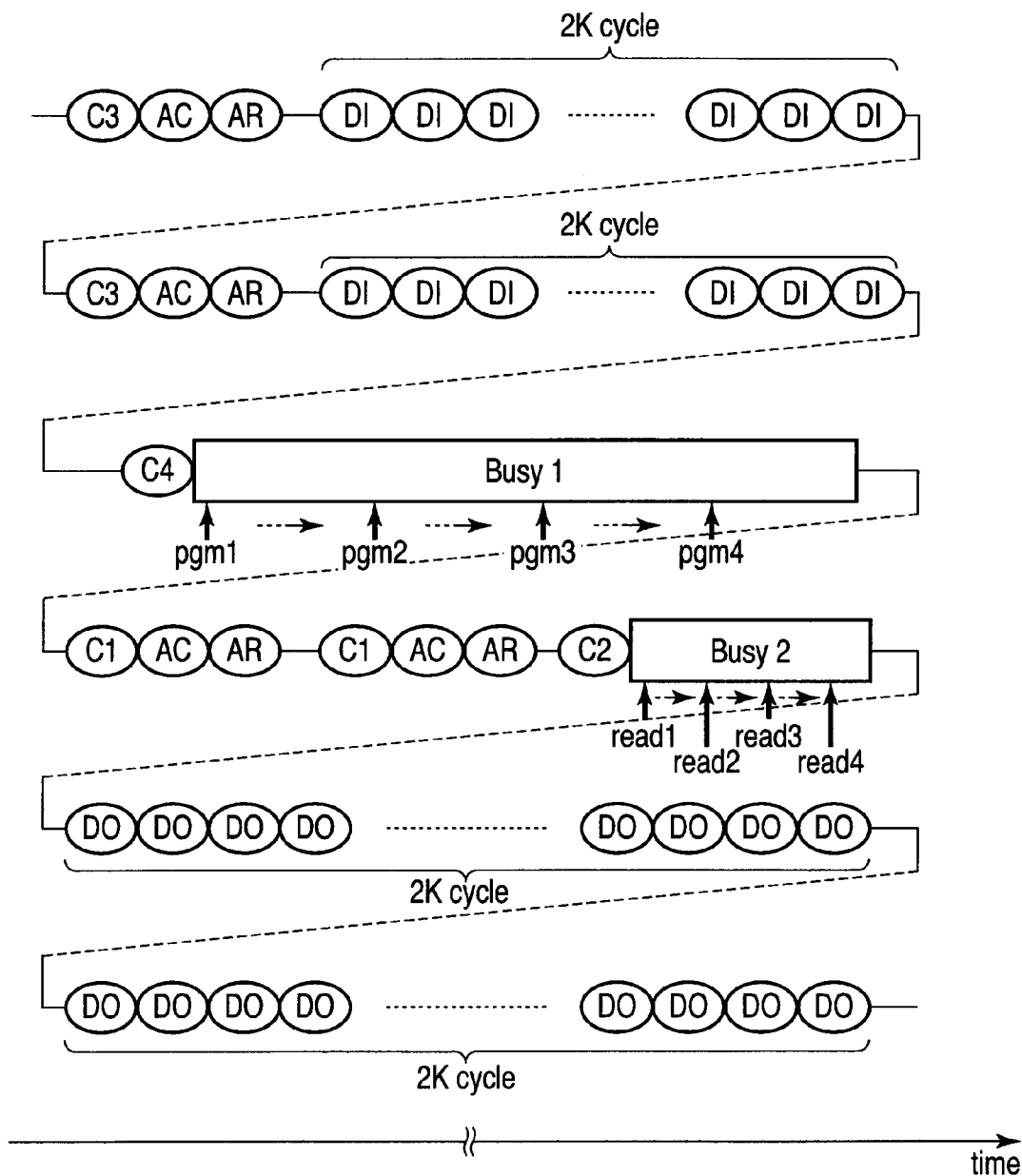
FIG. 18 is a view showing the control sequence of a semiconductor memory device according to the first modification.

A data read operation (a busy state (Busy 2): read1, read2, read3, and read4) in the control sequence shown in FIG. 18 is the same as the data write operation (the busy state (Busy 1)) described above. Therefore, a repetitive explanation of the same portions will be omitted.

<Effects>

As described above, the arrangement and control operation according to the first modification achieve at least the same effects as effects (1) to (4) described previously. In addition, this modification achieves at least effect (5) below.

(5) The modification is more advantageous in dispersing the power and increasing the access speed.

As described above, this modification further includes the counter circuits CO1 (+2) and CO2 (+2) for counting up (+2), 1 at a time, addresses stored in the first and second address buffers CA1 and CA2. In other words, the address buffers CA1 and CA2 are given a counter function, and counter calculations of the two or more address buffers CA1 and CA2 are performed. This further disperses the power and increases the access speed.

The counter function of the counter circuits CO1 and CO2 is, e.g., the counter function of an address buffer or the like used in a NAND flash memory. More specifically, an address to be accessed is input first, and then the clock /WE is input. Consequently, count-up is performed by this clock (CLK). This makes it possible to read out a plurality of data by inputting an address once.

Similarly, the first and second address buffers CA1 and CA2 of this modification include the counter circuits CO1 (+2) and CO2 (+2) having a count-up function. Accordingly, after different addresses are input to the counter circuits CO1 (+2) and CO2 (+2), data in the first and second addresses are alternately loaded or output by the clock /WE, and the address buffers CA1 and CA2 perform count-up (+2). It is also possible to rapidly load or read out data by inputting a plurality of clocks /WE or a plurality of clocks /RE.

Accordingly, this modification is advantageous in further dispersing the power and increasing the access speed.

[Second Modification (Example Including Counter Circuits (+2) and (−2))]

A semiconductor memory device and a control method of the same according to the second modification will be explained below with reference to FIGS. 23 to 27. This modification is directed to an example including counter circuits in first and second address buffers CA1 and CA2. In this explanation, a repetitive explanation of the same portions as in the first embodiment described previously will be omitted.

<Configuration Example>

First, an example of the configuration of the semiconductor memory device according to the second modification will be explained below with reference to FIG. 23.

Figure 23:
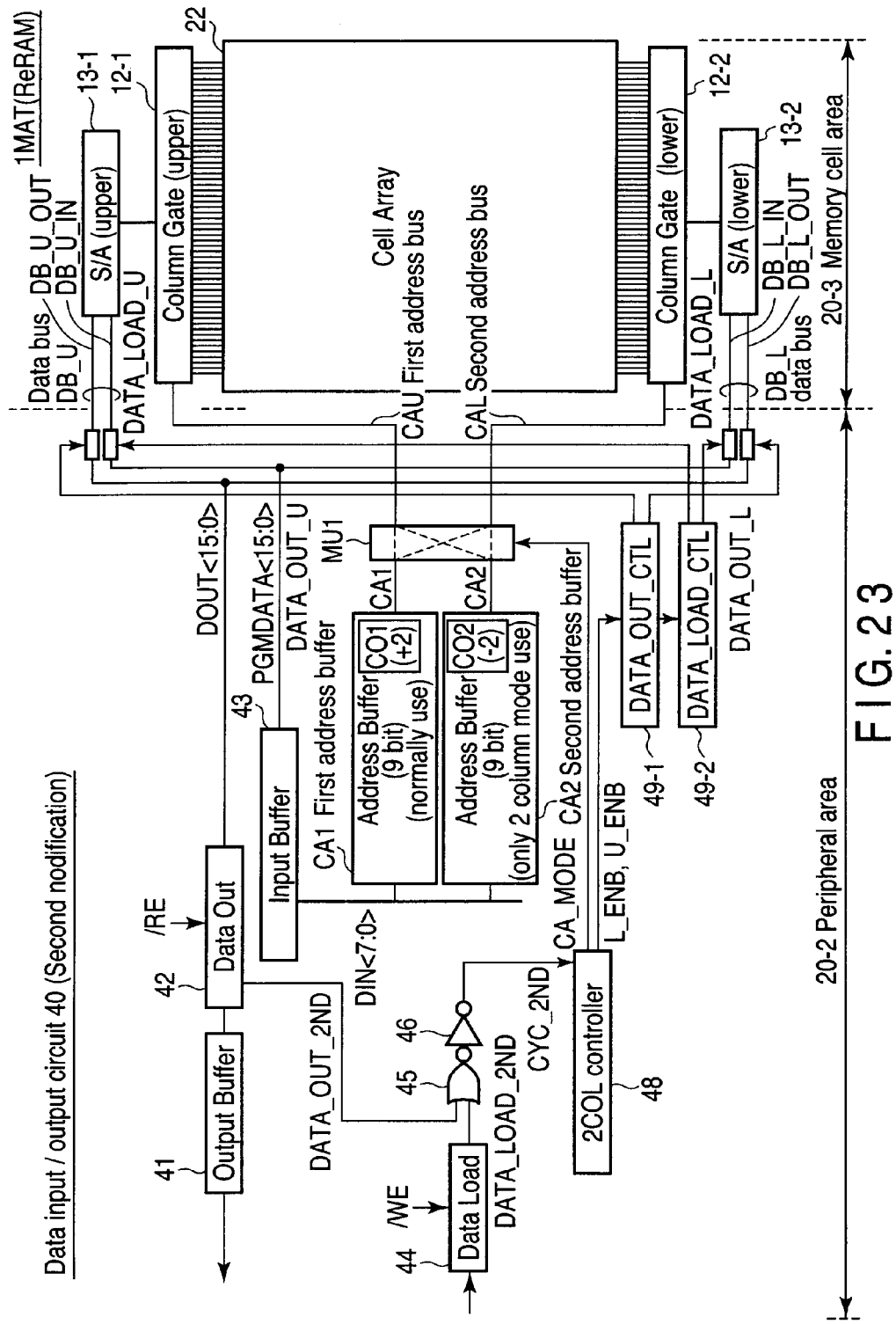
FIG. 23 is a view showing a data input/output circuit and one MAT according to the second modification.

As shown in FIG. 23, the semiconductor memory device according to this modification differs from the first embodiment in that the first and second address buffers CA1 and CA2 include counter circuits CO1 (+2) and CO2 (−2) having a count-up function.

The second counter circuit CO2 (−2) counts down (−2), −2 at a time, an address stored in the second address buffer CA2. More specifically, whenever a clock /WE is input during data loading or a clock /RE is input during data output, the second counter circuit CO2 (−2) counts down (−2), −2 at a time, an address stored in the second address buffer CA2.

<Control Operation>

A control operation complying with the control sequence of the semiconductor memory device according to this modification will be explained below with reference to FIGS. 24 to 27. This explanation will be made in accordance with a data write operation (a busy state (Busy 1): pgm1, pgm2, and pgm3) in the control sequence shown in FIG. 24. A repetitive explanation of the same portions as described previously will be omitted.

Busy State (Busy 1): pgm1

FIG. 25 shows the state of access to memory cells in this state.

As shown in FIG. 25, the first and second counter circuits CO1 and CO2 count up addresses stored in the first and second address buffers CA1 and CA2 by +2 and −2, respectively. Therefore, when an address 4K is input to the second address buffer CA2, for example, memory cells are accessed from the left end toward the center of a cell array 22 in the upper portion, and in the opposite direction, i.e., from the right end toward the center of the cell array 22 in the lower portion.

Busy State (Busy 1): pgm2

FIG. 26 shows the state of access to memory cells in this state.

As shown in FIG. 26, memory cells are accessed further toward the right side of the cell array 22 in the upper portion, and further toward the left side of the cell array 22 in the lower portion.

Busy State (Busy 1): pgm3

FIG. 27 shows the state of access to memory cells in this state.

As shown in FIG. 27, memory cells are accessed further toward the right side of the cell array 22 in the upper portion, and in the opposite direction, i.e., further toward the left side of the cell array 22 in the lower portion.

Note that a controller 17 controls the access in this busy state (Busy 1), and changes the access address 2K times (2K cycle).

Figure 24:
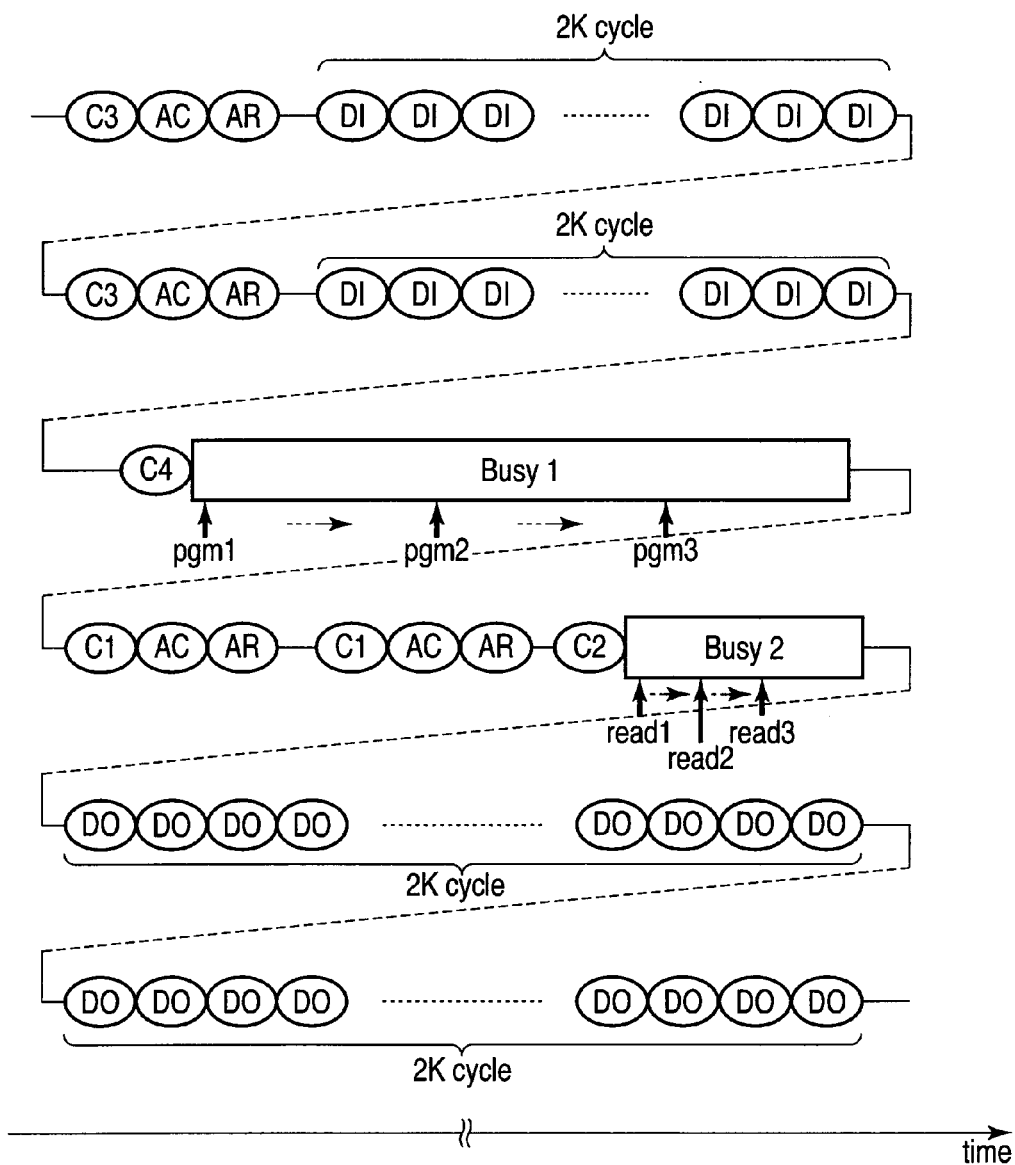
FIG. 24 is a view showing the control sequence of a semiconductor memory device according to the second modification.

A data read operation (a busy state (Busy 2): read1, read2, and read3) in the control sequence shown in FIG. 24 is the same as the data write operation (the busy state (Busy 1)) described above. Therefore, a repetitive explanation of the same portions will be omitted.

<Effects>

As described above, the arrangement and control operation according to the second modification achieve at least the same effects as effects (1) to (5) described previously.

In this modification as described above, the first counter circuit CO1 counts up an address stored in the first address buffer CA1 by +2, and the second counter circuit CO2 counts down an address stored in the second address buffer CA2 by 2. When an address "00" is input to the first counter circuit CO1 and an address "MAX" is input to the second counter circuit CO2, for example, memory cells can be accessed as they intersect each other in the memory cell array 22.

As described in this modification, it is also possible to change the way the first and second address buffers CA1 and CA2 perform count-up as needed.

[Third Modification (Example in which Arithmetic Circuit Performs +2K Counter Operation)]

A semiconductor memory device and a control method of the same according to the third modification will be explained below with reference to FIGS. 28 to 30. This modification is directed to an example in which an arithmetic unit CAL1 performs a 2-Kbyte adding operation when the page size is 4 Kbytes. In this explanation, a repetitive explanation of the same portions as in the first embodiment described previously will be omitted.

<Configuration Example>

First, an example of the configuration of the semiconductor memory device according to the third modification will be explained below with reference to FIG. 28.

Figure 28:
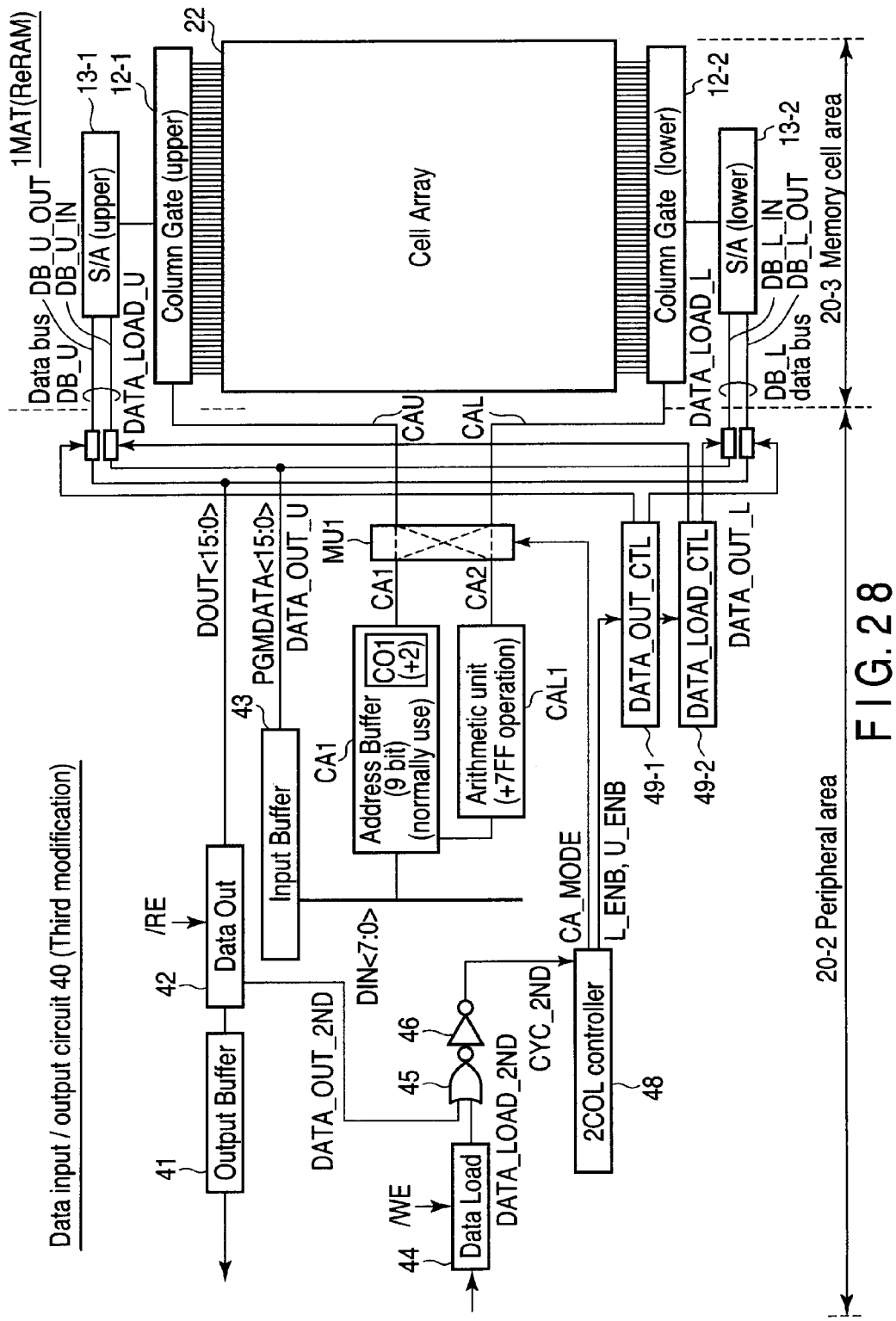
FIG. 28 is a view showing a data input/output circuit and one MAT according to the third modification.
Figure 29:
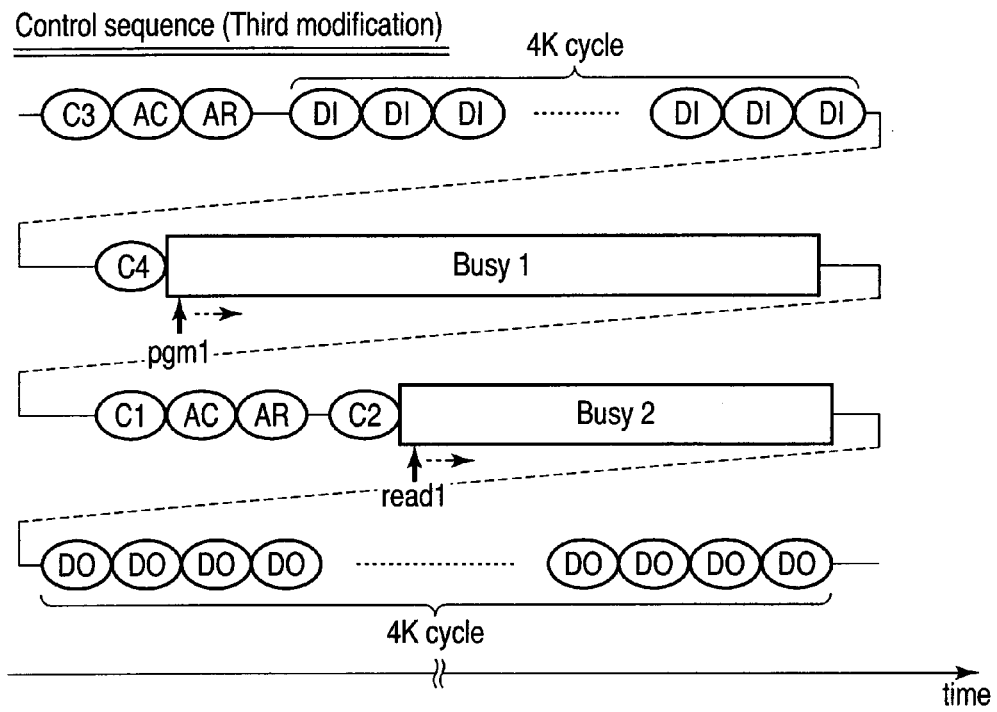
FIG. 29 is a view showing the control sequence of a semiconductor memory device according to the third modification.

As shown in FIG. 28, the semiconductor memory device according to this modification differs from the first embodiment in that the arithmetic unit CAL1 adds 1 Kbyte. In other words, this modification is directed to an example in which, in a form where a first address buffer CA1 is the only address buffer and the arithmetic unit generates an address corresponding to the second address buffer, the first address buffer CA1 includes a counter circuit CO1 having a +2 count-up function, and the arithmetic unit CAL1 performs the 1-Kbyte adding operation when the page size is 4 Kbytes.

<Control Operation>

A control operation complying with the control sequence of the semiconductor memory device according to this modification will be explained below with reference to FIGS. 29 and 30. This explanation will be made by taking, for example, a data write operation (a busy state (Busy 1): pgm1) in the control sequence shown in FIG. 29. A repetitive explanation of the same portions as described previously will be omitted.

Busy State (Busy 1): pgm1

Figure 30:
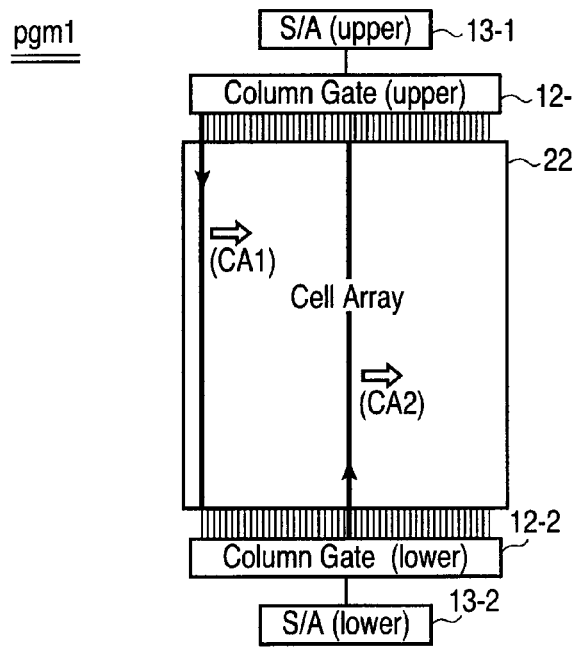
FIG. 30 is a view showing the state of access to memory cells in a busy state shown in FIG. 29.

FIG. 30 shows the state of access to memory cells in this state.

As shown in FIG. 30, the first counter circuit CO1 counts up an address stored in the first address buffer CA1 by +2, and the arithmetic unit CAL1 counts up an address corresponding to the arithmetic unit CAL by +2 by the 1-Kbyte adding operation. Therefore, for example, memory cells are accessed from the left end toward the center of a cell array 22 in the upper portion, and from the center toward the left side of the cell array 22 in the lower portion.

As described above, the arrangement and control operation according to the third modification achieve at least the same effects as effects (1) to (5) described previously. In addition, as in this modification, it is also possible to apply the arrangement and control operation of this modification as needed.

[Fourth Modification (Example in which Arithmetic Unit Inverts All Bits)]

A semiconductor memory device and a control method of the same according to the fourth modification will be explained below with reference to FIGS. 31 to 33. This modification is directed to an example in which an arithmetic unit CAL1 inverts all bits at the first address. In this explanation, a repetitive explanation of the same portions as in the first embodiment described previously will be omitted.

<Configuration Example>

First, an example of the configuration of the semiconductor memory device according to the third modification will be explained below with reference to FIG. 31.

As shown in FIG. 31, the semiconductor memory device according to this modification differs from the first embodiment in that the arithmetic unit CAL1 performs an all-bit inverting operation. In other words, this modification is an example in which a first address buffer CA1 has a +2 count-up function, and the arithmetic unit CAL1 is practically given a −2 count-down function by inverting the first address.

<Control Operation>

A control operation complying with the control sequence of the semiconductor memory device according to this modification will be explained below with reference to FIGS. 32 and 33. This explanation will be made by taking, for example, a data write operation (a busy state (Busy 1): pgm1) in the control sequence shown in FIG. 32. A repetitive explanation of the same portions as described previously will be omitted.

Busy State (Busy 1): pgm1

FIG. 33 shows the state of access to memory cells in this state.

As shown in FIG. 33, a first counter circuit CO1 counts up an address stored in the first address buffer CA1 by +2, and the arithmetic unit CAL1 counts up an address corresponding to the arithmetic unit CAL by −2 by the all-bit inverting operation. Therefore, for example, memory cells are accessed from the left end toward the center of a cell array 22 in the upper portion, and in the opposite direction, i.e., from the left side toward the center of the cell array 22 in the lower portion.

As described above, the arrangement and control operation according to the fourth modification achieve at least the same effects as effects (1) to (5) described previously. In addition, as in this modification, it is also possible to apply the arrangement and control operation of this modification as needed.

COMPARATIVE EXAMPLE

NAND Flash Memory

A semiconductor memory device and a control method of the same according to a comparative example will be explained below with reference to FIGS. 34 to 36 for comparison with the semiconductor memory devices and the control methods of the same according to the first and second embodiments described above. This comparative example is an example of a NAND flash memory. In this explanation, a repetitive explanation of the same portions as in the first embodiment will be omitted.

<Overall Configuration Example>

As shown in FIG. 34, the NAND flash memory according to this comparative example includes a memory cell array 100, row decoder 111, column gate 112, sense amplifier 113, address buffer 114-1, command buffer 114-2, fuse register 115, power on reset circuit 116, controller 117, voltage generator 118, and input/output buffer 119.

<Configuration Example of Memory Cell Array 100>

Figure 35:
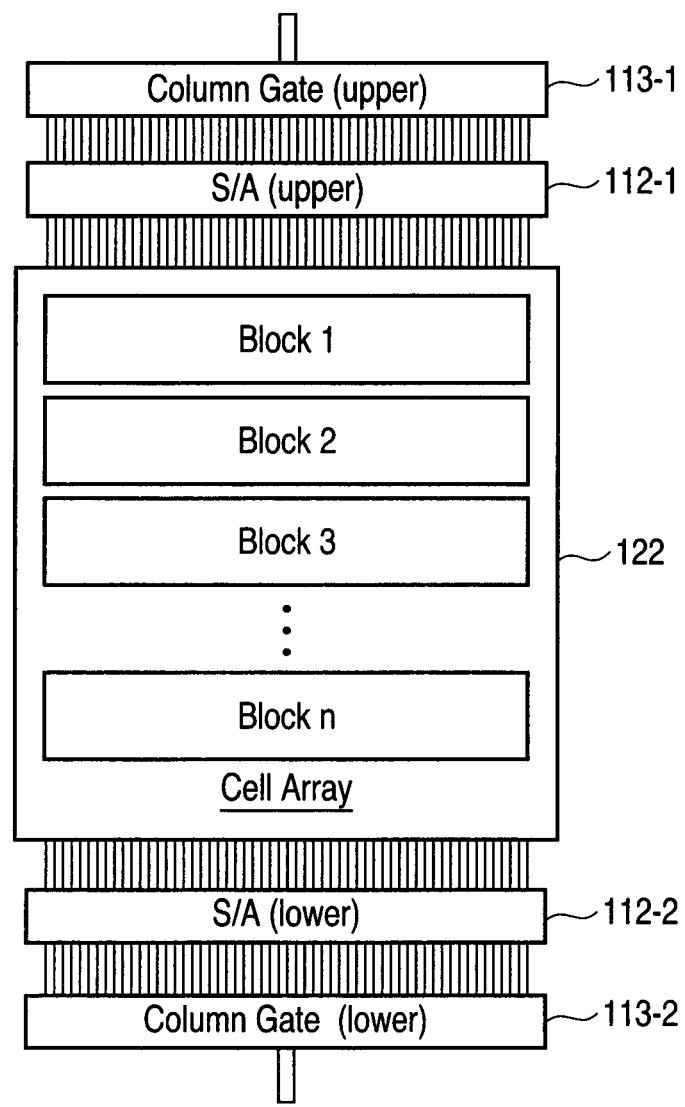
FIG. 35 is a view showing a memory cell array of the semiconductor memory device according to the comparative example.
Figure 36:
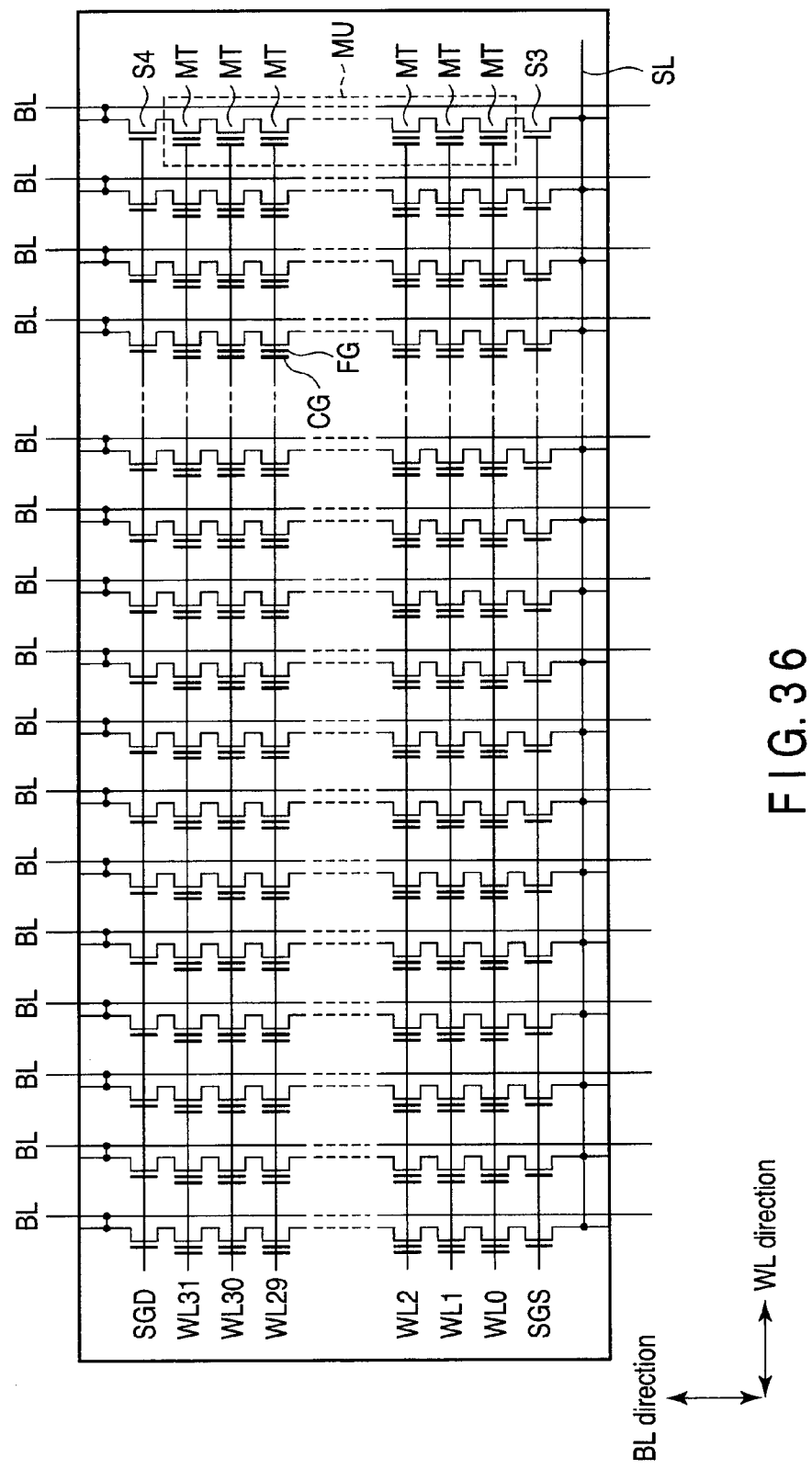
FIG. 36 is an equivalent circuit diagram showing a block shown in FIG. 35.

As shown in FIG. 35, the memory cell array 100 includes a cell array 122 including a plurality of blocks (Block 1, Block 2, . . . , Block n), sense amplifiers 112-1 and 112-2, and column gates 113-1 and 113-2.

As shown in FIG. 35, the positions of the sense amplifiers 112-1 and 112-2 and column gates 113-1 and 113-2 in the BL direction are switched from those of the above-mentioned embodiments. That is, in this comparative example, the sense amplifiers 112-1 and 112-2 are arranged closer to the cell array 122. The number of the sense amplifiers 112-1 and 112-2 is equal to or half that of bit lines.

The comparative example also differs from the above embodiments in that the selection of a desired column by an address buffer is performed between an IO bus (not shown) and the sense amplifiers 112-1 and 112-2. In the NAND flash memory according to this comparative example, therefore, the sense amplifiers 112-1 and 112-2 are arranged in one-to-one correspondence with bit lines BL. By contrast, in the ReRAMs (nonvolatile random access memories) according to the above embodiments, the sense amplifiers 12-1 and 12-2 are not arranged in one-to-one correspondence with the bit lines BL; the number of the sense amplifiers 12-1 and 12-2 is very small.

Note that although not shown, the NAND flash memory according to this comparative example includes one address buffer, and one address bus formed between a memory cell area (CORE) and a peripheral area.

<Configuration Example of Block>

An example of the configuration of the block according to this comparative example will be explained below with reference to FIG. 36. This explanation will be made by taking one block (Block 1) shown in FIG. 35 as an example. An erase operation of the NAND flash memory is performed for each block. Therefore, the block is the erase unit.

The block Block 1 includes a plurality of memory cell units MU arranged in the word line direction, and selection transistors S3 and S4 for selecting memory cell units MU.

The memory cell unit MU includes 32 memory cell transistors MT whose current paths are connected in series. One end of the current path of the selection transistor S3 is connected to one end of the current path of the memory cell unit MU. One end of the current path of the selection transistor S4 is connected to the other end of the current path of the memory cell unit MU. In this comparative example, the memory cell unit MU includes the 32 memory cells MT. However, the memory cell unit MU need only include two or more memory cells, so the number of the memory cells is not particularly limited to 32.

A read operation and write operation of the NAND flash memory are performed for each page formed for each of word lines WL0 to WL31. Accordingly, the page is the read unit and the write unit.

The other end of the current path of the selection transistor S3 is connected to a source line SL. The other end of the current path of the selection transistor S4 is connected to a bit line BL.

The word line WL runs in the word line direction, and is connected to control electrodes CG of a plurality of memory cell transistors MT in the word line direction. A select gate line SGS runs in the word line direction, and is connected to the gate electrodes of a plurality of selection transistors S3 in the word line direction. A select gate line SGD also runs in the word line direction, and is connected to the gate electrodes of a plurality of selection transistors S4 in the word line direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory cell arrays each comprising a plurality of memory cells, the plurality of memory cell arrays being stacked on a semiconductor substrate to form a three-dimensional structure; and
a data input/output circuit comprising a first address buffer and a second address buffer configured to store a first address and a second address of the plurality of memory cells, and a controller configured to perform control to time-divisionally output the first address and the second address to a first address bus and a second address bus in data input/output,
wherein each memory cell array further comprises:
a first sense amplifier and a second sense amplifier electrically connected to a first data bus and a second data bus; and
a first column gate and a second column gate configured to decode the first address and the second address;
the data input/output circuit further comprises:
a first address bus and a second address bus respectively connected to the first sense amplifier and the second sense amplifier;
a multiplexer configured to selectively output column addresses held in the first address buffer and the second address buffer to one of the first address bus and the second address bus in accordance with a control signal from the controller; and
an input buffer connected to the first address buffer, the second address buffer, the first address bus, and the second address bus.

2. The device of claim 1, wherein an interface complying with a NAND flash memory is applied to the semiconductor memory device.

3. The device of claim 1, wherein the first address buffer and the second address buffer further comprise a first counter circuit and a second counter circuit configured to count up the first address and the second address.

4. The device of claim 1, wherein the data input/output circuit further comprises:
a data output circuit having an input terminal connected to the first address bus and the second address bus, and configured to output readout data in accordance with the number of cycles of an external read signal; and
an output buffer having an input terminal connected to an output terminal of the data output circuit, and configured to output readout data outside when receiving the external read signal.

5. The device of claim 1, wherein the memory cell comprises:
a variable resistance element whose current path has one end connected to a bit line; and
a diode including an anode connected to the other end of the current path of the variable resistance element, and a cathode connected to a word line.

6. A semiconductor memory device comprising:
a plurality of memory cell arrays each comprising a plurality of memory cells, the plurality of memory cell arrays being stacked on a semiconductor substrate to form a three-dimensional structure; and
a data input/output circuit comprising a first address buffer configured to store a first address of the plurality of memory cells, an arithmetic unit configured to determine a second address from the first address in accordance with a predetermined operation expression, and a controller configured to perform control to time-divisionally output the first address and the second address to a first address bus and a second address bus in data input/output.

7. The device of claim 6, wherein the memory cell array further comprises:
a first sense amplifier and a second sense amplifier electrically connected to a first data bus and a second data bus; and
a first column gate and a second column gate configured to decode the first address and the second address.

8. The device of claim 6, wherein an interface complying with a NAND flash memory is applied to the semiconductor memory device.

9. The device of claim 6, wherein the data input/output circuit further comprises a second address buffer configured to store the second address, and wherein the first address buffer and the second address buffer further comprise a first counter circuit and a second counter circuit configured to count up the first address and the second address.

10. The device of claim 7, wherein the data input/output circuit further comprises:
a first address bus and a second address bus respectively connected to the first sense amplifier and the second sense amplifier;
a multiplexer configured to selectively output column addresses held in the first address buffer and a second address buffer to one of the first address bus and the second address bus in accordance with a control signal from the controller; and
an input buffer connected to the first address buffer, the second address buffer, the first address bus, and the second address bus.

11. The device of claim 7, wherein the data input/output circuit further comprises:
a data output circuit having an input terminal connected to the first address bus and the second address bus, and configured to output readout data in accordance with the number of cycles of an external read signal; and
an output buffer having an input terminal connected to an output terminal of the data output circuit, and configured to output readout data outside when receiving the external read signal.

12. The semiconductor memory device of claim 6, wherein the memory cell comprises:
a variable resistance element whose current path has one end connected to a bit line; and
a diode including an anode connected to the other end of the current path of the variable resistance element, and a cathode connected to a word line.

13. A control method of a semiconductor memory device including a plurality of memory cell arrays each including a plurality of memory cells, the plurality of memory cell arrays being stacked on a semiconductor substrate to form a three-dimensional structure, the method comprising:
controlling a sequence of an operation of writing data in a memory cell such that:
a first input command, a first address, and first data are input as a first unit;
a second input command, a second address, and second data are input as a second unit; and
data are written by a data input/output circuit in the plurality of memory cells in one of the memory cell arrays after a write command is input;
wherein the memory cell array further comprises:
a first sense amplifier and a second sense amplifier electrically connected to a first data bus and a second data bus; and
a first column gate and a second column gate configured to decode the first address and the second address;
wherein the data input/output circuit further comprises:
a first address bus and a second address bus respectively connected to the first sense amplifier and the second sense amplifier;
a multiplexer configured to selectively output column addresses held in a first address buffer and a second address buffer to one of the first address bus and the second address bus in accordance with a control signal from a controller; and
an input buffer connected to the first address buffer, the second address buffer, the first address bus, and the second address bus.

14. The control method of claim 13, wherein an interface complying with a NAND flash memory is applied to the semiconductor memory device.

15. The method of claim 13, wherein the first address buffer and the second address buffer further comprise a first counter circuit and a second counter circuit configured to count up the first address and the second address.

16. The method of claim 13, wherein the data input/output circuit further comprises:
a data output circuit having an input terminal connected to the first address bus and the second address bus, and configured to output readout data in accordance with the number of cycles of an external read signal; and
an output buffer having an input terminal connected to an output terminal of the data output circuit, and configured to output readout data outside when receiving the external read signal.

* * * * *